US012575231B2

(12) United States Patent
Antoniadis

(10) Patent No.: US 12,575,231 B2
(45) Date of Patent: Mar. 10, 2026

(54) LIGHT EMITTING DIODE ARRAY CONTAINING METAMATERIAL LIGHT COLLIMATING FEATURES AND METHODS FOR FORMING THE SAME

(71) Applicant: SAMSUNG ELECTRONICS CO., LTD., Suwon-si (KR)

(72) Inventor: Homer Antoniadis, Mountain View, CA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 533 days.

(21) Appl. No.: 18/057,353

(22) Filed: Nov. 21, 2022

(65) Prior Publication Data

US 2023/0163262 A1      May 25, 2023

Related U.S. Application Data

(60) Provisional application No. 63/281,820, filed on Nov. 22, 2021.

(51) Int. Cl.
*H10H 20/855* (2025.01)
*G02B 1/00* (2006.01)
(Continued)

(52) U.S. Cl.
CPC ........... *H10H 20/855* (2025.01); *G02B 1/002* (2013.01); *G02B 3/0037* (2013.01);
(Continued)

(58) Field of Classification Search
CPC .......... H01L 25/0753; H10H 29/30–49; H10H 20/855; H10H 29/855; H10H 20/0363;
(Continued)

(56) References Cited

U.S. PATENT DOCUMENTS

| | | | |
|---|---|---|---|
| 10,996,451 | B2 | 5/2021 | Tamma |
| 2015/0129851 | A1 | 5/2015 | Lee et al. |

(Continued)

FOREIGN PATENT DOCUMENTS

| | | |
|---|---|---|
| CN | 110727038 A | 1/2020 |
| KR | 10-2017-0102641 | 9/2017 |

OTHER PUBLICATIONS

ISR—Notification of Transmittal of The International Search Report and Written Opinion of the International Searching Authority for International Patent Application No. PCT/US2022/050604, mailed Apr. 13, 2023, 9 pages.

(Continued)

*Primary Examiner* — Kevin Parendo
(74) *Attorney, Agent, or Firm* — Sughrue Mion, PLLC

(57) ABSTRACT

A light emitting device includes a backplane, first, second and third light emitting diodes located on the backplane, a first patterned metamaterial lens containing first nanostructures located over the first light emitting diode, a second patterned metamaterial lens containing second nanostructures located over the second light emitting diode, and a third patterned metamaterial lens containing third nanostructures located over the light emitting diode. A configuration of the first nanostructures differs from a configuration of the second nanostructures, and a configuration of the third nanostructures differs from the configurations of the first and the second nanostructures.

20 Claims, 23 Drawing Sheets

<table>
<tr><td>(51)</td><td colspan="2"><b>Int. Cl.</b></td></tr>
</table>

(51) Int. Cl.

| | |
|---|---|
| *G02B 3/00* | (2006.01) |
| *H01L 25/075* | (2006.01) |
| *H01L 25/16* | (2023.01) |
| *H10H 20/01* | (2025.01) |
| *H10H 20/825* | (2025.01) |
| *H10H 29/01* | (2025.01) |
| *H10H 29/80* | (2025.01) |
| *H10H 29/851* | (2025.01) |
| *H10H 29/855* | (2025.01) |

(52) U.S. Cl.
CPC ........ *H01L 25/0753* (2013.01); *H01L 25/167* (2013.01); *H10H 20/0361* (2025.01); *H10H 29/0361* (2025.01); *H10H 29/0363* (2025.01); *H10H 29/8513* (2025.01); *H10H 29/855* (2025.01); *H10H 29/872* (2025.01); *G02B 2207/101* (2013.01); *H10H 20/825* (2025.01)

(58) Field of Classification Search
CPC ............ H10H 29/0363; H10H 20/872; H10H 29/872; H10K 59/12–1315; H10K 59/35–353; H10K 59/879
See application file for complete search history.

(56) References Cited

U.S. PATENT DOCUMENTS

| 2018/0172988 A1* | 6/2018 | Ahmed .................. G06T 11/00 |
|---|---|---|
| 2018/0277523 A1 | 9/2018 | Ahmed et al. |
| 2019/0371866 A1 | 12/2019 | Kim et al. |
| 2020/0035837 A1* | 1/2020 | Ahmed ............... H10H 29/142 |
| 2020/0044125 A1* | 2/2020 | Chen .................... H10H 20/855 |
| 2020/0259307 A1 | 8/2020 | Sharma et al. |
| 2020/0343230 A1* | 10/2020 | Sizov ...................... H01L 24/08 |
| 2021/0184072 A1 | 6/2021 | Gallagher et al. |
| 2021/0201769 A1* | 7/2021 | Morris .............. G02B 27/0093 |
| 2022/0352419 A1* | 11/2022 | Yang ................... H10H 29/142 |

OTHER PUBLICATIONS

Danz, N. et al., "Micro optical pattern shaping for tailored light emission from Organic LEDs," Optics Express, vol. 20, Issue 12, pp. 12682-12691 (2012) •https://doi.org/10.1364/OE.20.012682.

Mohtashami, Y. et al., "Light-emitting metalenses and meta-axicons for focusing and beaming of spontaneous emission," Nat. Commun., vol. 12, No. 3591, pp. 1-7, (2021). https://doi.org/10.1038/s41467-021-23433-0.

Neshev, D. et al., "Optical metasurfaces: new generation building blocks for multi-functional optics," Light: Science & Applications 2018, Vo. 7, No. 58, pp. 1-5, (2018); DOI 10.1038/s41377-018-0058-1.

Radiant Vision Systems, "Going Meta: How Metalenses are Reshaping the Future of Optics," https://www.radiantvisionsystems.com/blog/going-meta-how-metalenses-are-reshaping-future-optics (viewed on Nov. 21, 2022).

vimeo.com, "Optical Metasurfaces: From Fundamental Science to Application—Dr. Robert Devlin," https://vimeo.com/325699643, (viewed on Nov. 21, 2022).

* cited by examiner

LIGHT EMITTING DIODE ARRAY CONTAINING METAMATERIAL LIGHT COLLIMATING FEATURES AND METHODS FOR FORMING THE SAME

FIELD

The present invention relates to light emitting devices, and particularly to a light emitting diode array containing metamaterial collimating features and methods for forming the same.

BACKGROUND

Light emitting devices such as light emitting diodes (LEDs) are used in electronic displays, such as backlights in liquid crystal displays located in laptops or televisions, LED billboards, microdisplays, and LED televisions. A microLED refers to a light emitting diode having lateral dimensions that do not exceed 1 mm. A microLED has a typical lateral dimension in a range from 1 microns to 150 microns. An array of microLEDs can form an individual pixel element. A direct view display device can include an array of pixel elements, each of which includes several microLEDs which emit light having a different emission spectrum.

SUMMARY

According to an aspect of the present disclosure, a light emitting device includes a backplane, first, second and third light emitting diodes located on the backplane, a first patterned metamaterial lens containing first nanostructures located over the first light emitting diode, a second patterned metamaterial lens containing second nanostructures located over the second light emitting diode, and a third patterned metamaterial lens containing third nanostructures located over the light emitting diode. A configuration of the first nanostructures differs from a configuration of the second nanostructures, and a configuration of the third nanostructures differs from the configurations of the first and the second nanostructures.

DETAILED DESCRIPTION

Figure 1:
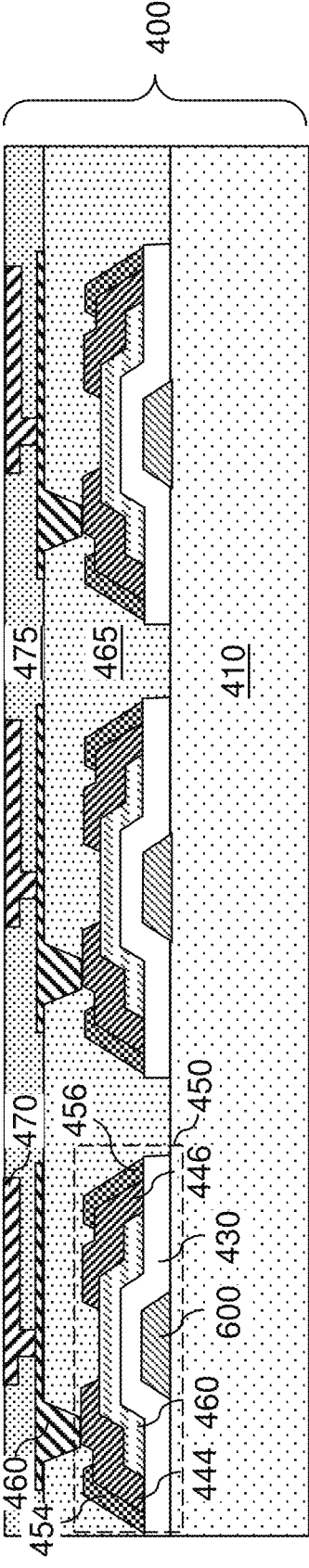
FIG. 1 is a vertical cross-sectional view of a region of a first exemplary structure including a backplane according to an embodiment of the present disclosure.

Generally, photons emitted from a light emitting diode follows a Lambertian emission pattern, and are not collimated. Lack of collimation of emitted light from light emitting elements is an impediment in effective implementation of a high density light emitting device array, such as heads up display devices, virtual reality display devices or artificial reality display devices. In other words, a high degree of collimation of emitted light is advantageous for high-definition high-fidelity display devices. The embodiments of the present disclosure are directed to a light emitting diode array containing metamaterial light collimating features and methods for forming the same. The array may be used in heads up display devices, virtual reality display devices, artificial reality display devices, or other suitable devices.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "layer" refers to a continuous portion of at least one material including a region having a thickness. A layer may consist of a single material portion having a homogeneous composition, or may include multiple material portions having different compositions.

As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "semiconducting material" refers to a material having electrical conductivity in the range from $1.0 \times 10^{-6}$ S/cm to $1.0 \times 10^5$ S/cm. As used herein, a "metallic material" refers to a conductive material including at least one metallic element therein. All measurements for electrical conductivities are made at the standard condition.

A display device, such as a heads up display device, virtual reality display device or artificial reality display device can be formed from an ordered array of pixels. Each pixel can include a set of subpixels that emit light at a respective emission spectrum. For example, a pixel can include a red subpixel, a green subpixel, and a blue subpixel. In one embodiment, each subpixel can include one or more light emitting diodes that emit light of one of several peak wavelengths (e.g., red light, green light and blue light). In another embodiment, all light emitting diodes emit radiation of the same peak wavelength (e.g., ultraviolet radiation or light in the blue color spectrum which includes blue and violet color light). Each pixel is driven by a backplane circuit such that any combination of colors within a color gamut may be shown on the display for each pixel. The display panel can be formed by a process in which LED subpixels are soldered to, or otherwise electrically attached to, a bond pad located on a backplane. The bond pad is electrically driven by the backplane circuit and other driving electronics.

Referring to FIG. 1, a first exemplary structure includes a backplane 400. The backplane 400 includes a backplane substrate 410, which can be an insulating substrate. A control circuitry for controlling operation of the light emitting diodes attached to the backplane 400 may be provided within the backplane. For example, switching devices 450 can be provided within the backplane 400. In an illustrative example, the switching devices 450 can include field effect transistors, such as thin film transistors (TFTs). In this case, each field effect transistor 450 may include a gate electrode 420, a gate dielectric 430, a channel region 442, a source region 446, and a drain region 444. While an inverted staggered TFT 450 is shown in FIG. 1, other types of TFTs, such as inverted coplanar, top gated staggered and top gated coplanar TFTs can be used instead. Other type of switching devices may also be used instead of or in addition to the TFTs 450. Various electrical wirings can be provided to interconnect the various electrical nodes of the field effect transistors to electrical interfaces (not expressly shown) on the backplane 400. A patterned passivation layer 454 may be optionally formed on the source regions 446 and the drain regions 444. Additional interconnect wiring may be provided as needed. The switching devices 450 can be encapsulated by an encapsulation dielectric layer 465. First-level metal interconnect structures 460 can be formed through the encapsulation dielectric layer 465 to a node of a respective switching device 450 such as a drain region 444. An interconnect level dielectric layer 475 may be formed over the encapsulation dielectric layer 465, and second-level metal interconnect structures 470 can be formed through the interconnect level dielectric layer 475 on the first-level metal interconnect structures 460. The second-level metal interconnect structures 470 can include an array of bonding pads for attaching the array of light emitting diodes 10.

Figure 2:
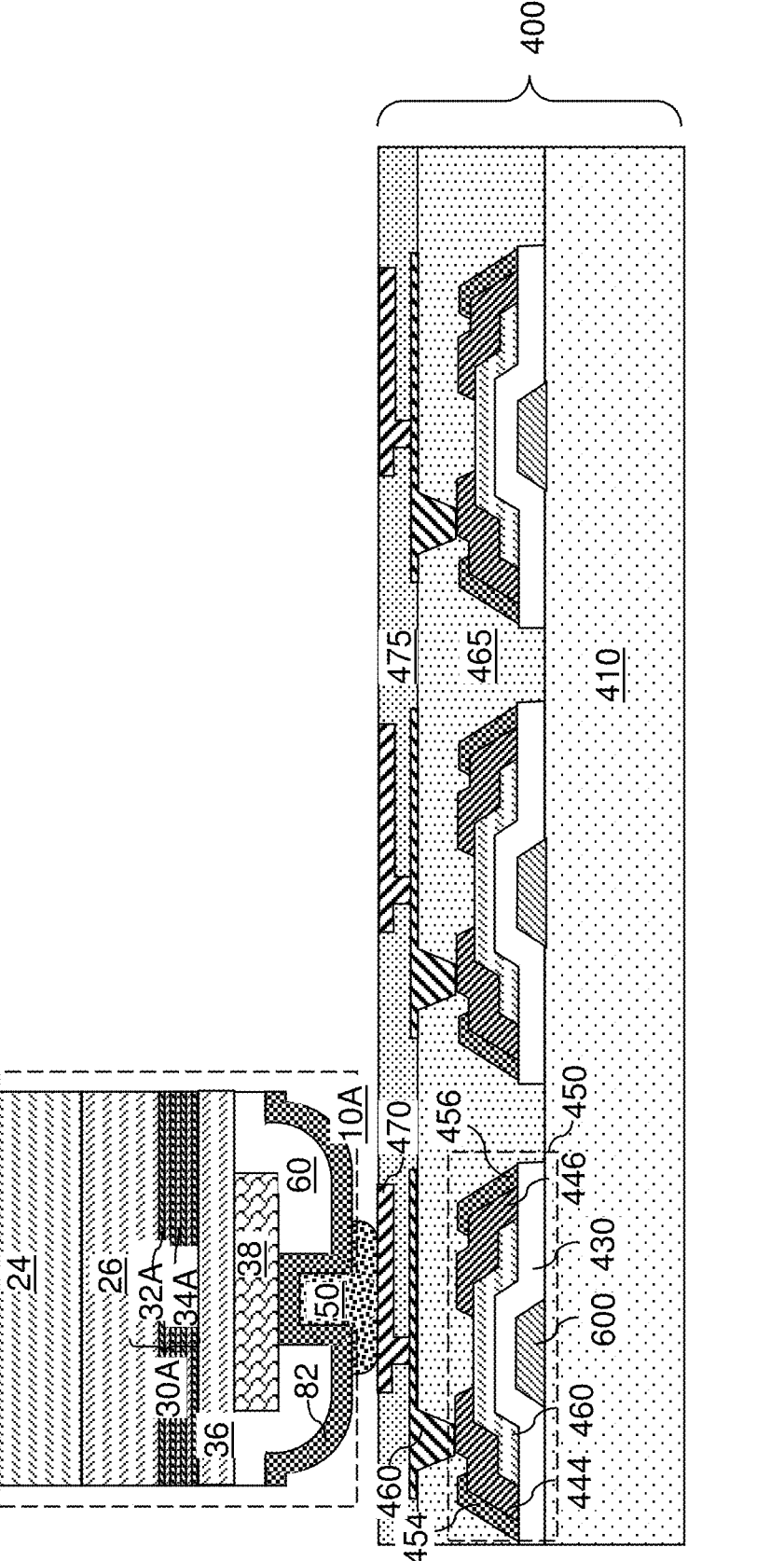
FIG. 2 is a vertical cross-sectional view of a region of the first exemplary structure after attaching first light emitting diodes according to an embodiment of the present disclosure.

In one embodiment illustrated in FIGS. 2 to 6, different color light emitting diodes are attached to the backplane in different subpixels. Referring to FIG. 2, first light emitting diodes 10A can be attached to a first subset of physically exposed metal bonding pads, which are a subset of the metal interconnect structures (460, 470) located within the backplane 400. In one embodiment, the first subset of the physically exposed metal bonding pads may be, for example, a first subset of the second-level metal interconnect structures 470. While the present disclosure is described employing a backplane 400 including two levels of metal interconnect structures (460, 470), it is understood that the backplane 400 may include any number of metal interconnect levels. Generally, an array of bonding structures can be provided on the front side of the backplane 400, and the array of light emitting diodes can be bonded to a respective bonding structure within the backplane 400 employing any bonding method known in the art.

Generally, an array of first light emitting diodes 10A can be attached to a first subset of the metal interconnect structures (460, 470) (such as metal bonding pads) in the backplane 400. The first light emitting diodes 10A can be configured to emit light at a first peak wavelength, which may be, for example a red light having a wavelength range between 620 nm to 750 nm. Each first light emitting diode 10A may comprise an optional buffer layer 24 and a first doped compound semiconductor layer 26 (such as an n-doped GaN layer). The first doped compound semiconductor layer 26 has a doping of a first conductivity type (such as n-type), and is epitaxially aligned to the single crystalline structure of the buffer layer 24 (if present). In an illustrative example, the buffer layer 24 may comprise a buffer III-V compound semiconductor material (e.g., GaN or AlGaN) having a doping of the first conductivity type, and may have a lattice constant that is substantially matched to the lattice constant of the single crystalline substrate 22. In some embodiment, the buffer layer 24 may have a compositional gradient so that the top portion of the buffer layer 24 has a lattice constant of a first doped compound semiconductor material of the first doped compound semiconductor layer 26. In an illustrative example, the first conductivity type may be n-type. The thickness of the buffer layer 24 may be in a range from 0.5 micron to 10 microns, such as from 1 micron to 3 microns, although lesser and greater thicknesses may also be employed.

In a non-limiting illustrative example, the first doped compound semiconductor layer 26 may comprise a single crystalline gallium nitride material in epitaxial alignment with the single crystalline structure of the buffer layer 24. The single crystalline n-doped gallium nitride layer may be formed, for example, by an epitaxial deposition process such as metal-organic chemical vapor deposition (MOCVD) process. The single crystalline n-doped gallium nitride layer may be n-doped by introduction of silicon as n-type dopants during the epitaxial deposition process.

A first active layer 30A is located on the first doped compound semiconductor layer 26. The first active layer 30A includes a set of doped compound semiconductor material layers that is configured to emit light at the first peak wavelength. In one embodiment, the first active layer 30A may comprise a periodic repetition of first compound semiconductor layers 32A and second compound semiconductor layers 34A that forms a quantum well. The material compositions and the thicknesses of the first compound semiconductor layers 32A and second compound semiconductor layers 34A can be selected such that the first active layer 30A emits light at the first peak wavelength. Additional material layers configured to increase the quantum efficiency of the light emission may be present within the first active layer 30A. Alternatively, non-quantum-well structures may be employed for the first active layer 30A. In a non-limiting illustrative example, the first active layer 30A may comprise a planar light-emitting indium gallium nitride layer, a planar GaN barrier layer, and an optional planar p-doped III-nitride layer (such as a p-doped aluminum gallium nitride layer). Generally, the first active layer 30A may comprise any set of doped compound semiconductor material layers that is configured to emit light at the first peak wavelength.

A second doped compound semiconductor portion 36 is located on the first active layer 30A. The second doped compound semiconductor portion 36 includes a doped semiconductor material having a doping of a second conductivity type that is the opposite of the first conductivity type. In an illustrative example, the first doped compound semiconductor layer 26 may comprise an n-doped III-V compound semiconductor material (such as n-doped GaN), and the second doped compound semiconductor portions 36 may comprise a p-doped III-V compound semiconductor material (such as p-doped GaN or AlGaN). The second doped compound semiconductor portions 36 may have a thickness in a range from 100 nm to 1 micron, such as from 200 nm to 500 nm, although lesser and greater thicknesses may also be employed.

An optional transparent p-side electrode 38 may be formed on each second doped compound semiconductor region 36. The p-side electrode 38 may comprise an optically transparent, electrically conductive material, such as a transparent conductive oxide. Examples of a transparent conductive oxide include indium tin oxide, aluminum zinc oxide, or fluorine doped tin oxide.

Each first light emitting diode 10A may comprise an insulating spacer 60 that provides electrical isolation to the second doped compound semiconductor portion 36 and the first active layer 30A. Further, each first light emitting diode 10A may comprise a reflector 82 including an optically reflective material (such as aluminum, silver, gold, or copper), and configured to reflect light toward a distal surface of the first doped compound semiconductor layer 26 (such as an interface between the first doped compound semiconductor layer 26 and the buffer layer 24). In one embodiment, the reflector 82 may be electrically connected to the second doped compound semiconductor portion 36, for example, by vertically extending through an opening in the insulating spacer 60 and directly contacting the second doped compound semiconductor portion 36, or by contacting the p-side electrode 38 that is interposed between the vertically protruding portion of the reflector 82 and the second doped compound semiconductor portion 36. The reflector 82 may have a thickness in a range from 10 nm to 300 nm, such as from 30 nm to 100 nm, although lesser and greater thicknesses may also be employed.

Each first light emitting diode 10A may be attached to the backplane 400, for example, through an array of solder contacts, such as an array of solder material portions 50. For example, the array of solder material portions 50 can be formed in the recess regions of the reflectors 82 of the first light emitting diodes 10A, and can be bonded to a respective metal bonding structure in the backplane 400, which may be a metal interconnect structure such as a second-level metal interconnect structure 470. Alternatively, the array of solder material portions 50 may be formed on metal bonding structures in the backplane 400 (such as the second-level metal interconnect structures 470), and can be bonded to a respective one of the recess regions of the reflectors 82.

Figure 3A:
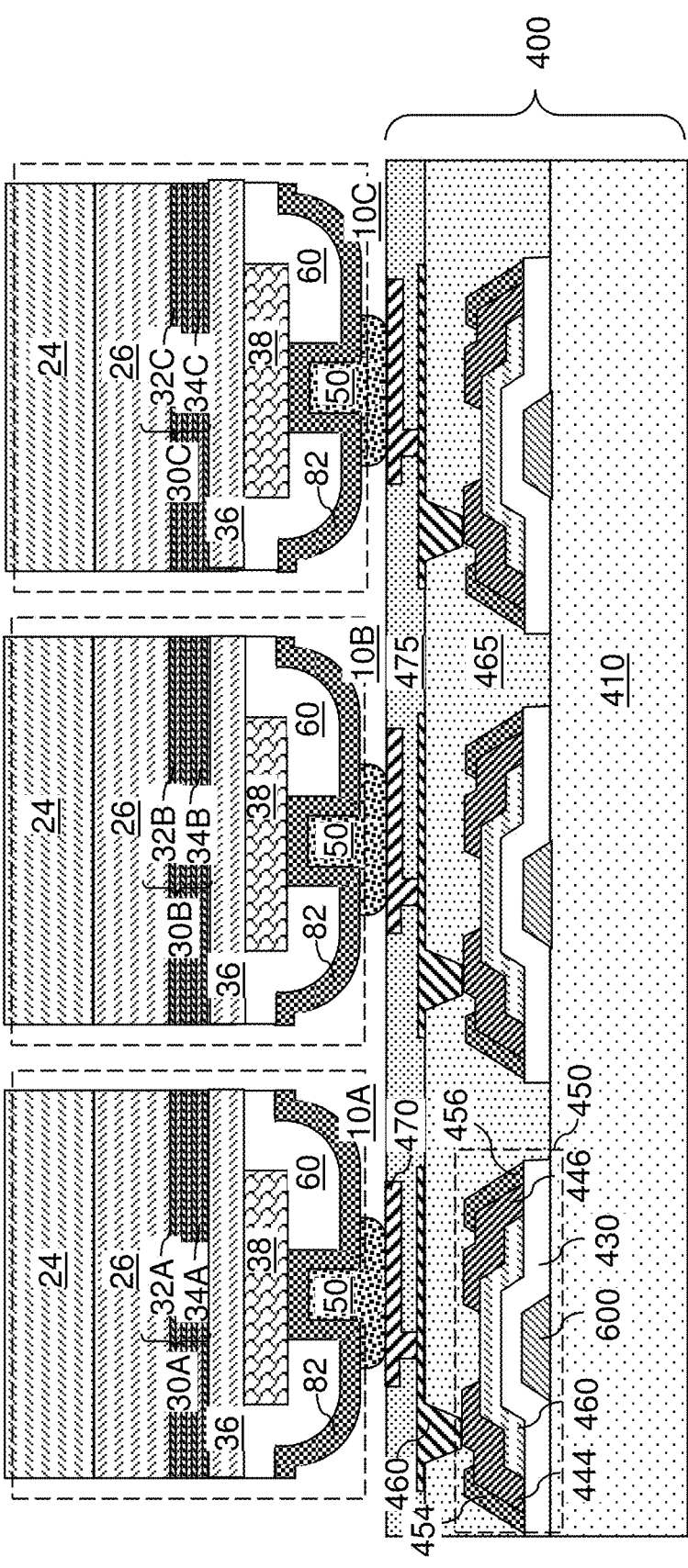
FIG. 3A is a vertical cross-sectional view of a region of the first exemplary structure after attaching second light emitting diodes and third light emitting diodes according to an embodiment of the present disclosure.
Figure 3B:
FIG. 3B is a top-down view of the first exemplary structure of FIG. 3A.

Referring to FIGS. 3A and 3B, an array of second light emitting diodes 10B can be attached to a second subset of the metal interconnect structures (460, 470) (such as metal bonding pads) in the backplane 400. The second light emitting diodes 10B can be configured to emit light at a second peak wavelength, which may be, for example a green light having a wavelength range between 530 nm to 570 nm. The second light emitting diodes 10B may differ from the first light emitting diodes 10A by the structure of an active layer therein, which is herein referred to as a second active layer 30B. The second active layer 30B includes a set of doped compound semiconductor material layers that is configured to emit light at the second peak wavelength. In one embodiment, the second active layer 30B may comprise a periodic repetition of first compound semiconductor layers 32B and second compound semiconductor layers 34B that forms a quantum well. The material compositions and the thicknesses of the first compound semiconductor layers 32B and second compound semiconductor layers 34B can be selected such that the second active layer 30B emits light at the second peak wavelength. For example, the first compound semiconductor layers 32B in the second light emitting diodes 10B may comprise indium gallium nitride having a higher indium concentration than the first compound semiconductor layers 32A in the first light emitting diodes 10A. Additional material layers configured to increase the quantum efficiency of the light emission may be present within the second active layer 30B. Alternatively, non-quantumwell structures may be employed for the second active layer 30B. Generally, the second active layer 30B may comprise any set of doped compound semiconductor material layers that is configured to emit light at the second peak wavelength.

Each second light emitting diode 10B may be attached to the backplane 400, for example, through an array of solder contacts, such as an array of solder material portions 50. For example, the array of solder material portions 50 can be formed in the recess regions of the reflectors 82 of the second light emitting diodes 10B, and can be bonded to a respective metal bonding structure in the backplane 400, which may be a metal interconnect structure such as a second-level metal interconnect structure 470. Alternatively, the array of solder material portions 50 may be formed on metal bonding structures in the backplane 400 (such as the second-level metal interconnect structures 470), and can be bonded to a respective one of the recess regions of the reflectors 82.

An array of third light emitting diodes 10C can be attached to a third subset of the metal interconnect structures (460, 470) (such as metal bonding pads) in the backplane 400. The third light emitting diodes 10C can be configured to emit light at a third peak wavelength, which may be, for example a blue light having a wavelength range between 420 nm to 480 nm. The third light emitting diodes 10C may differ from the first light emitting diodes 10A by the structure of an active layer therein, which is herein referred to as a third active layer 30C. The third active layer 30C includes a set of doped compound semiconductor material layers that is configured to emit light at the third peak wavelength. In one embodiment, the third active layer 30C may comprise a periodic repetition of first compound semiconductor layers 32C and second compound semiconductor layers 34C that forms a quantum well. The material compositions and the thicknesses of the first compound semiconductor layers 32C and second compound semiconductor layers 34C can be selected such that the third active layer 30C emits light at the third peak wavelength. For example, the first compound semiconductor layers 32C in the third light emitting diodes 10C may comprise indium gallium nitride having a higher indium concentration than the first compound semiconductor layers 32B in the second light emitting diodes 10A. Additional material layers configured to increase the quantum efficiency of the light emission may be present within the third active layer 30C. Alternatively, non-quantum-well structures may be employed for the third active layer 30C. Generally, the third active layer 30C may comprise any set of doped compound semiconductor material layers that is configured to emit light at the third peak wavelength.

Each third light emitting diode 10C may be attached to the backplane 400, for example, through an array of solder contacts, such as an array of solder material portions 50. For example, the array of solder material portions 50 can be formed in the recess regions of the reflectors 82 of the third light emitting diodes 10C, and can be bonded to a respective metal bonding structure in the backplane 400, which may be a metal interconnect structure such as a second-level metal interconnect structure 470. Alternatively, the array of solder material portions 50 may be formed on metal bonding structures in the backplane 400 (such as the second-level metal interconnect structures 470), and can be bonded to a respective one of the recess regions of the reflectors 82.

Generally, an array of light emitting diodes (10A, 10B, 10C) can be attached to the backplane 400. In one embodiment, the array of light emitting diodes (10A, 10B, 10C) comprises a first sub-array of first light emitting diodes 10A configured to emit light at a first peak wavelength, a second sub-array of second light emitting diodes 10B configured to emit light at a second peak wavelength, and a third sub-array of third light emitting diodes 10C configured to emit light at a third peak wavelength. The first peak wavelength, the second peak wavelength, and the third peak wavelength are different from each other. As used herein, a sub-array refers to an array that is a subset of, and includes less elements than, another array of elements.

In one embodiment, each light emitting diode (10A, 10B, 10C) within the array of light emitting diodes (10A, 10B, 10C) comprises a vertical stack including a first doped compound semiconductor layer 26, an active layer (30A, 30B, or 30C) configured to emit light at a respective peak wavelength, and a second doped compound semiconductor portion 36. In one embodiment, each light emitting diode (10A, 10B, 10C) within the array of light emitting diodes (10A, 10B, 10C) is attached to a respective metal interconnect structure (such as the second-level metal interconnect structures 470) within the backplane 400 via an array of solder material portions 50.

As shown in FIG. 3B, each light emitting diode (10A, 10B, 10C) may comprise a subpixel of a pixel "P" of a display device. For example, the pixel P may include at least one red, at least one green and at least one blue light emitting diode. Other color light emitting diodes may also be used.

Figure 4:
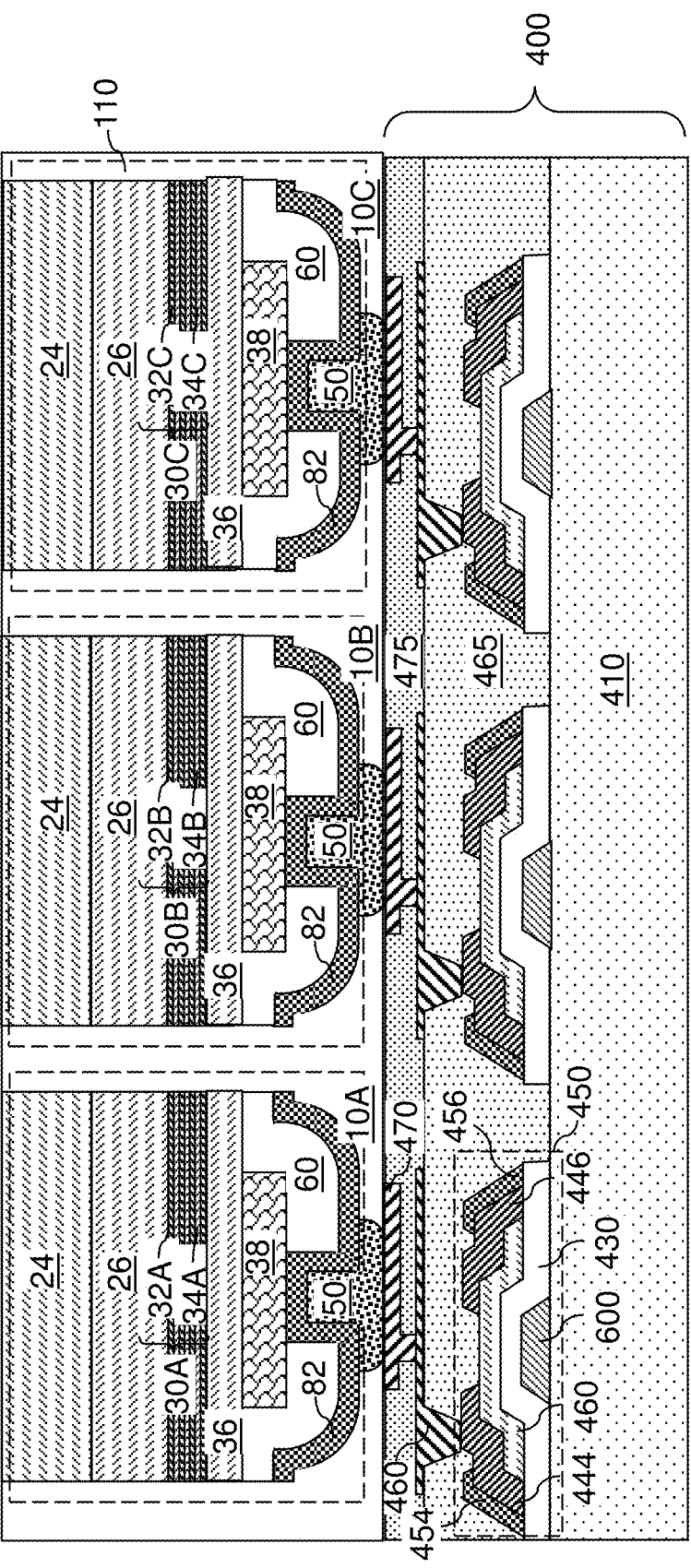
FIG. 4 is a vertical cross-sectional view of the first exemplary structure after formation of a dielectric matrix layer according to an embodiment of the present disclosure.

Referring to FIG. 4, a dielectric fill material such as an underfill material, silicon oxide, or a polymer material can be deposited in gaps between neighboring pairs of light emitting diodes (10A, 10B, 10C). The dielectric fill material may be deposited by injection, by a self-planarizing deposition method such as spin coating, or by a conformal deposition process such as chemical vapor deposition. Excess portions of the dielectric fill material can be removed from above the horizontal plane including distal horizontal surfaces of the light emitting diodes (10A, 10B, 10C). In one embodiment, the distal horizontal surfaces of the light emitting diodes (10A, 10B, 10C) may comprise backside surfaces of the buffer layers 24, or may comprise backside surfaces of the first doped compound semiconductor layers 26 (in case buffer layers 24 are not employed or removed during the planarization process that removes excess portions of the dielectric material).

Generally, the dielectric fill material can be applied around the array of light emitting diodes (10A, 10B, 10C) after attaching the array of light emitting diodes (10A, 10B, 10C) to the backplane 400, and portions of the dielectric fill material can be removed from above a horizontal plane including top surfaces of the array of light emitting diodes (10A, 10B, 10C). The remaining portion of the dielectric fill material comprises the dielectric matrix layer 110. An array of light emitting diodes (10A, 10B, 10C) laterally surrounded by the dielectric matrix layer 110 can be formed over the backplane 400. The array of light emitting diodes (10A, 10B, 10C) is attached to a front side of the backplane 400, and thus, is located above the backplane 400.

In one embodiment, the dielectric matrix layer 110 contacts sidewalls of each of the light emitting diodes (10A, 10B, 10C). In one embodiment, the dielectric matrix layer 110 may contact sidewalls of the buffer layer 24, sidewalls of the first doped compound semiconductor layer 26, sidewalls of the active layer (30A, 30B, 30C), sidewalls of the second doped compound semiconductor layer 36, sidewalls of the insulating spacer 60, and surfaces of the reflector 82 within each light emitting diode (10A, 10B, 10C). In one embodiment, the dielectric matrix layer 110 contacts, and laterally surrounds, each of the solder material portions 50.

Figure 5:
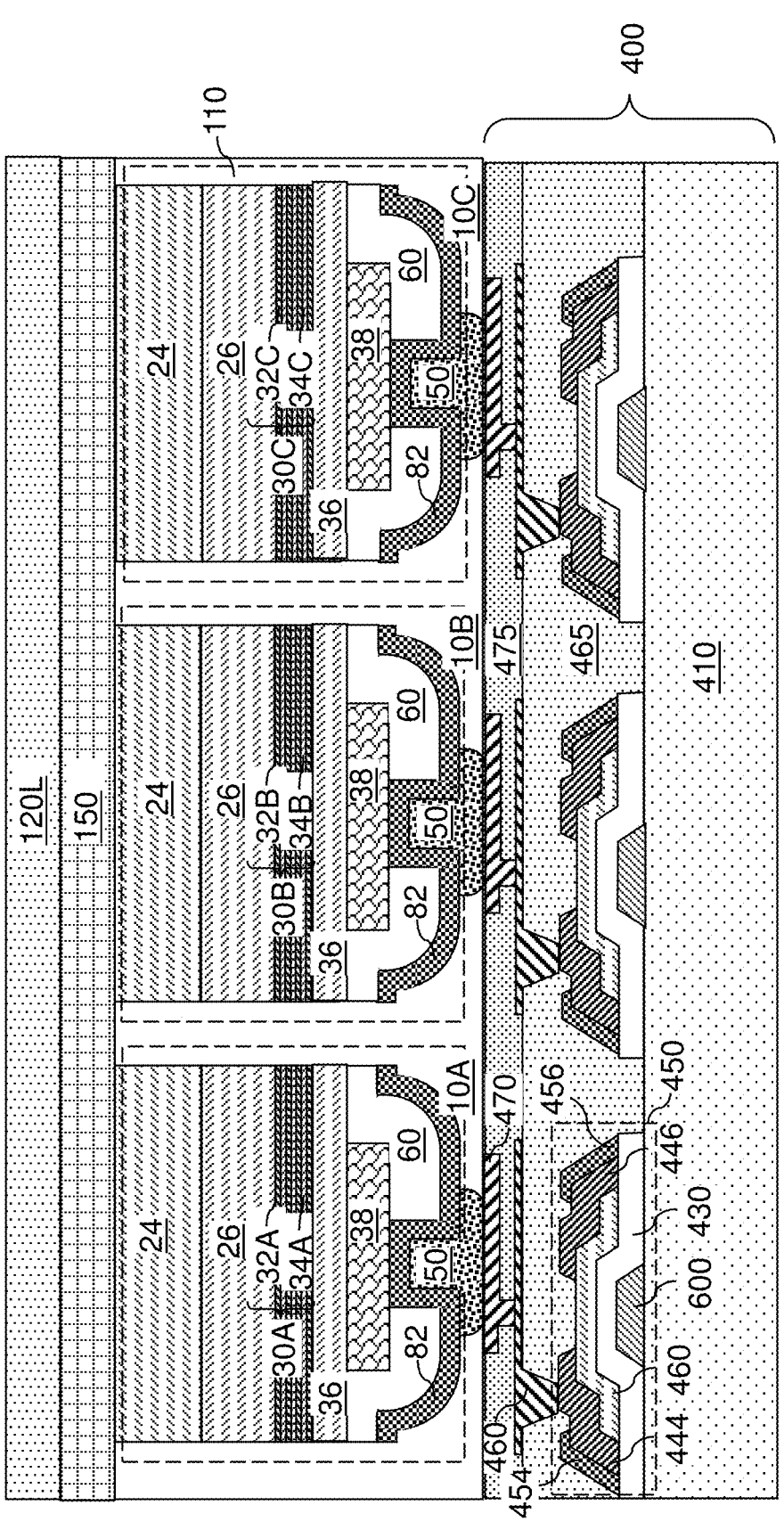
FIG. 5 is a vertical cross-sectional view of the first exemplary structure after forming a metamaterial layer on a front side of the array of light emitting diodes according to an embodiment of the present disclosure.

Referring to FIG. 5, a transparent conductive material layer 150 may be deposited on the front side of the array of light emitting diodes (10A, 10B, 10C). The transparent conductive material layer 150 can be deposited directly on the buffer layers 24 or directly on the first doped compound semiconductor layers 26, which are electrically connected to a first electrical node of a respective active layer (30A, 30B, 30C), i.e., the first doped compound semiconductor layer 26. In this case, the transparent conductive material layer 150 may function as a common ground node (e.g., common n-side electrodes) of the array of light emitting diodes (10A, 10B, 10C), and the solder material portions 50 can be electrically connected to a p-side electrode 38 of a respective light emitting diode. A voltage bias across a solder material portion 50 and the common ground node of the transparent conductive material layer 150 can induce light emission from a respective active layer (30A, 30B, or 30C). The transparent conductive material layer 150 may comprise a transparent conductive oxide material (such as indium tin oxide, fluorine-doped tin oxide, or a doped zinc oxide), a conductive polymer, a metal grid, or a random metallic or carbon nanotube network (e.g., network of metal nanowires or nanotubes above their percolation threshold). The thickness of the transparent conductive material layer 150 may be in a range from 3 nm to 300 nm, such as from 10 nm to 100 nm, although lesser and greater thicknesses may also be employed.

A metamaterial layer 120L can be deposited on the front side of the array of light emitting diodes (10A, 10B, 10C) directly on a distal horizontal surface of the transparent conductive material layer 150. For example, the metamaterial layer 120L may be deposited over the dielectric matrix layer 110 and over the array of light emitting diodes (10A, 10B, 10C). In one embodiment, the metamaterial layer 120L may comprise an optically transparent material having a wide band gap, i.e., a band gap having a magnitude greater than 2 eV. In one embodiment, the metamaterial layer 120L may comprise, and/or consist essentially of, a semiconductor material, such as silicon, silicon germanium or a III-V compound semiconductor material (such as GaN) or a dielectric metal oxide material (such as titanium oxide, tantalum oxide, aluminum oxide, yttrium oxide, lanthanum oxide, etc.) or silicon oxide. In another embodiment, the metamaterial layer 120L may comprise an optically opaque material, such as a metal, for example gold or silver. The metamaterial layer 120L may be deposited by chemical vapor deposition or atomic layer deposition. The thickness of the metamaterial layer 120L may be in a range from 30 nm to 2,000 nm, such as from 50 nm to 500 nm, although lesser and greater thicknesses may also be employed.

Figure 6:
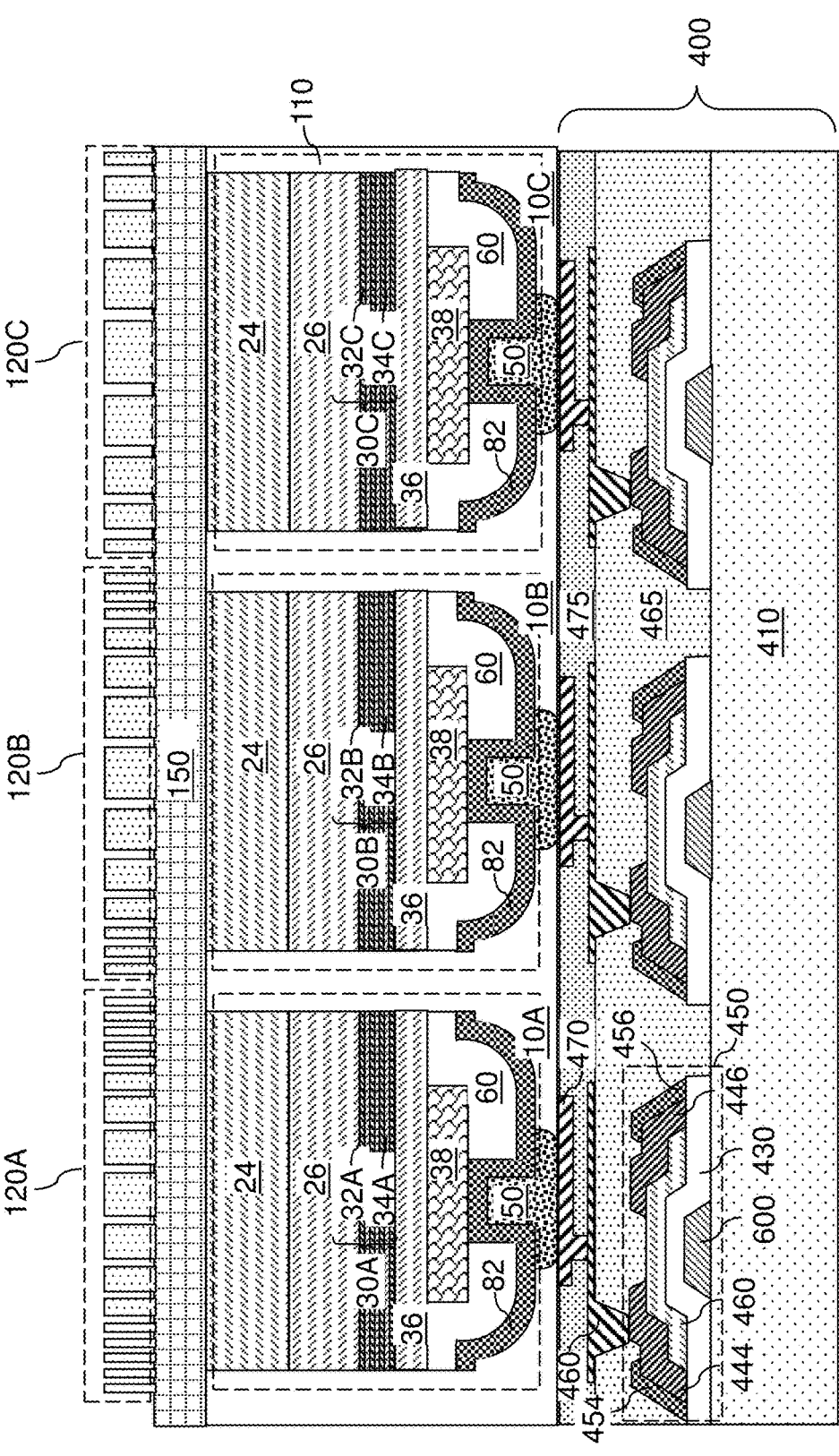
FIG. 6 is a vertical cross-sectional view of the first exemplary structure after patterning the metamaterial layer into an array of patterned metamaterial lenses according to an embodiment of the present disclosure.

Referring to FIGS. 6 and 7A-7F, the metamaterial layer 120L can be patterned into an array of patterned metamaterial lenses (120A, 120B, 120C). FIG. 6 is a vertical cross-sectional view of the first exemplary structure after patterning the metamaterial layer 120L into the array of patterned metamaterial lenses (120A, 120B, 120C). The metamaterial lenses may have at least one of length and/or width that is 800 nm or less, such as 10 nm to 800 nm, for example 50 nm to 200 nm, such as 50 nm to 150 nm. The metamaterial lenses (120A, 120B, 120C) can bend and/or focus visible light that is incident on these lenses, similar to optical lenses.

The metamaterial lenses (120A, 120B, 120C) are also known as optical metasurfaces, which are subwavelength (i.e., less than the wavelength (e.g., 400 to 800 nm) of visible light) dimension patterned layers or structures that interact strongly with light. Such lenses alter the light properties over a subwavelength thickness. In contrast to conventional optics, which rely on light refraction and propagation, the metamaterial lenses (120A, 120B, 120C) manipulate light based on scattering from small nanostructures. Such nanostructures can resonantly capture the light and re-emit it with a defined phase, polarization, modality and spectrum, thus allowing the bending of light waves.

The metamaterial lenses (120A, 120B, 120C) may comprise electrically conductive plasmonic nanostructures which bend light beams by phase manipulation, or dielectric (i.e., electrically insulating) nanostructures which exhibit strong Mie-type resonances of both electric and magnetic nature, where the resonant wavelength is proportional to the size of the nanostructure multiplied by the refractive index of the dielectric material. At resonance, the dielectric nanostructures have induced-electric or magnetic dipole (or higher-order) moments, the interference of which strongly affects the directionality of the light scattering.

Figure 7B:
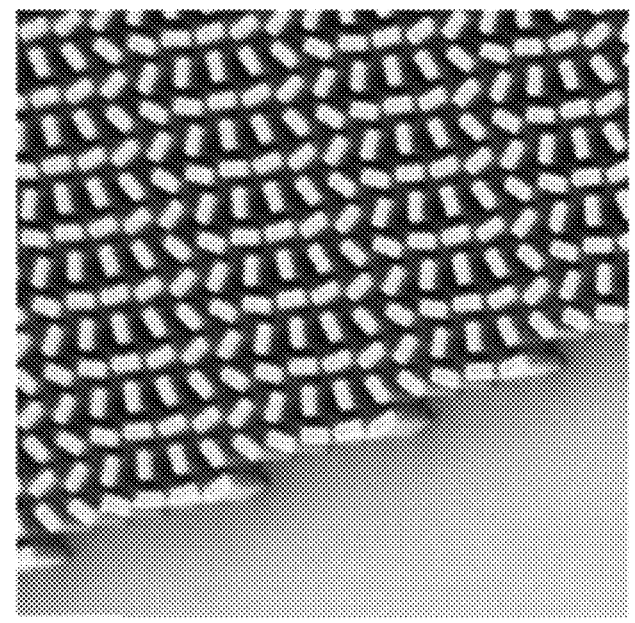
FIGS. 7A-7F illustrate exemplary patterns that may be employed for a patterned metamaterial lens according to an embodiment of the present disclosure.
Figure 7A:
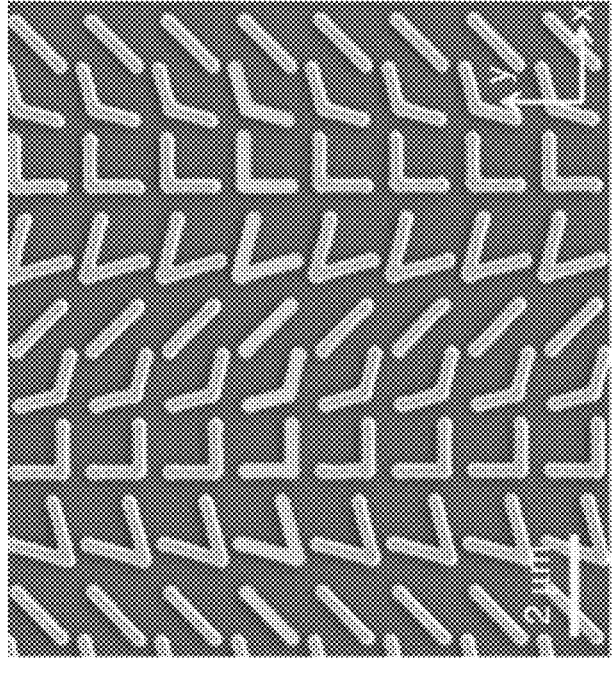
Figure 7D:
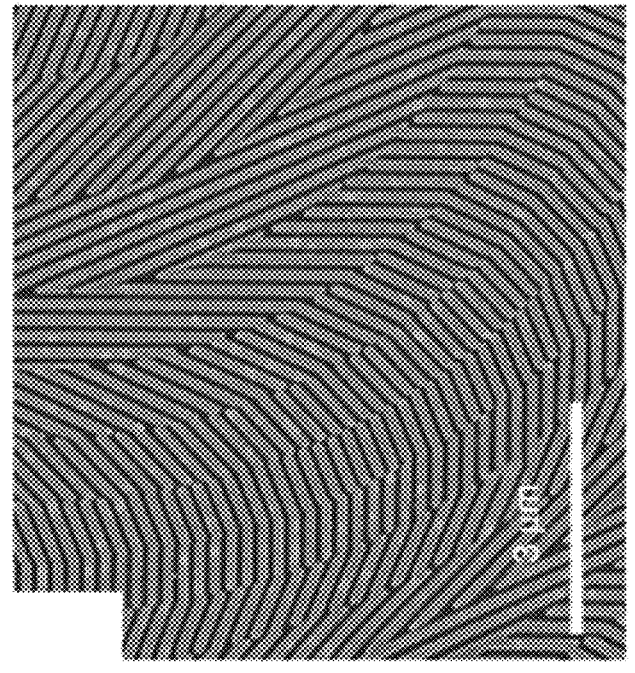
Figure 7C:
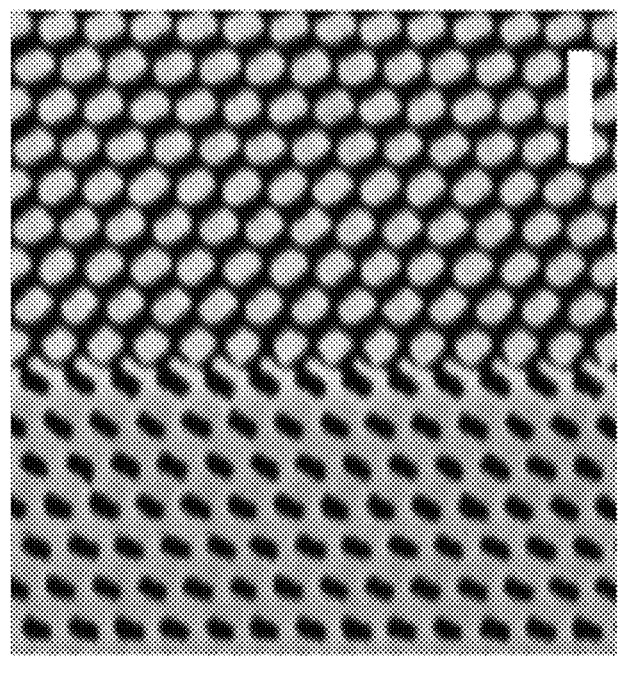
Figure 7E:
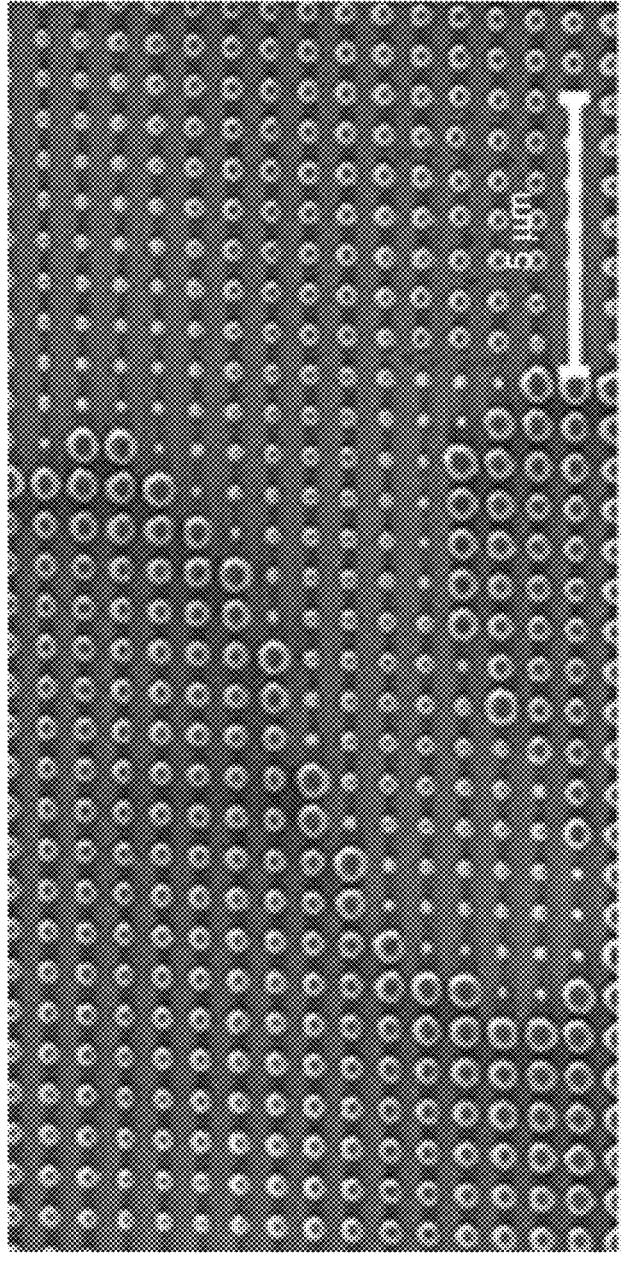
Figure 7F:
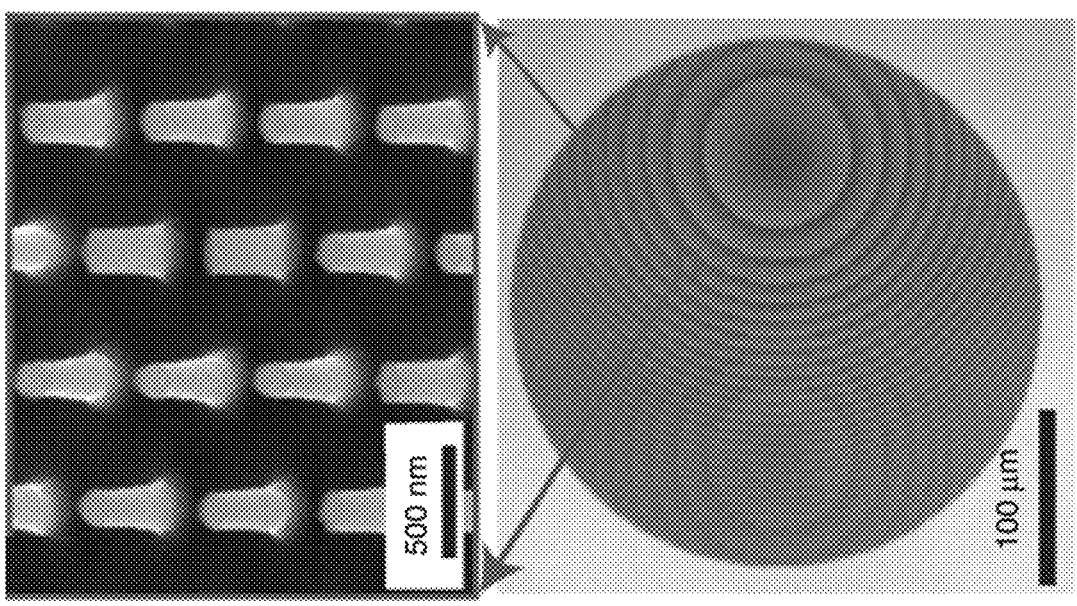

FIGS. 7A-7F illustrate exemplary patterns that may be employed for a patterned metamaterial lens according to an embodiment of the present disclosure. The metamaterial lenses illustrated in FIGS. 7A-7F are described in D. Neshev, et al., Light: Science & Applications (2018) 7:58, incorporated herein by reference in its entirety. FIG. 7A illustrates an optical metasurface composed of a gold antenna array. The unit cell of the plasmonic interface comprises eight gold V-shaped light antennas. FIG. 7B illustrates a metamaterial lens operating at 660 nm and consisting of $TiO_2$ nanofins on a glass substrate. Scale bar is 300 nm. FIG. 7C illustrates an Achromatic metamaterial lens with numerical aperture (NA)~0.1. Scale bar is 500 nm. The vertical boundary of nanopillars and Babinet structures is visible. FIG. 7D illustrates a fabricated meta-hologram that produces 5 mm large images at a distance of 10 mm. The posts are silicon on $SiO_2$, FIG. 7E is a SEM image of a dielectric metasurface lens based on Si nanobeams that results in a local Bessel spot focal length of 100 mm at λ=550 nm. FIG. 7F illustrates a dielectric metasurface made from amorphous silicon pillars on $SiO_2$ that separates x- and y-polarized light and focuses them to two different points.

In one embodiment, a photoresist layer (not shown) can be applied over the metamaterial layer 120L, and can be lithographically patterned to form an optical interference pattern that induces collimation of light that is emitted from a respective underlying light emitting diode (10A, 10B, 10C). Since the light emitting diodes of different types emit light at different peak wavelengths, the optical interference pattern that is formed over each light emitting diode (10A, 10B, 10C) may be optimized such that the optical interference pattern provides collimation for the wavelength of the light that is emitted from a respective underlying light emitting diode (10A, 10B, 10C). The pattern in the photoresist layer can be transferred through the metamaterial layer 120L by performing an etch process, which may comprise an anisotropic etch process (such as a reactive ion etch process). The metamaterial layer 120L can be patterned into the array of patterned metamaterial lenses (120A, 120B, 120C) by the etch process. The photoresist layer can be subsequently removed, for example, by ashing.

Each patterned metamaterial lens (120A, 120B, 120C) can have a pattern that collimates light that is emitted from a respective underlying light emitting diode (10A, 10B, 10C). First patterned metamaterial lenses 120A can be formed over first light emitting diodes 10A that emit light at the first peak wavelength, and can have a pattern that collimates light having the first peak wavelength with highest directionality. Second patterned metamaterial lenses 120B can be formed over second light emitting diodes 10B that emit light at the second peak wavelength, and can have a pattern that collimates light having the second peak wavelength with highest directionality. Third patterned metamaterial lenses 120C can be formed over third light emitting diodes 10C that emit light at the third peak wavelength, and can have a pattern that collimates light having the third peak wavelength with highest directionality.

Thus, the configuration, such as size (e.g., width and/or length) of the nanostructures, spacing between the nanostructures and/or direction (i.e., positional angle) of the nanostructures in the first patterned metamaterial lenses 120A may differ from the configuration of the second patterned metamaterial lenses 120B, and the configuration of the third patterned metamaterial lenses may different from the configurations of the first and the second patterned metamaterial lenses (120A, 120B). For example, if the first light emitting diodes 10A emit red light, then the configuration of the first patterned metamaterial lenses 120A may be configured to optimize collimation of red light. Likewise, if the second and third light emitting diodes (10B, 10C) emit green and blue light, respectively, then the configuration of the second patterned metamaterial lenses (120B, 120C) may be configured to optimize collimation of green and blue light, respectively. Generally, each patterned metamaterial lens (120A, 120B, 120C) within the array of patterned metamaterial lenses (120A, 120B, 120C) can be configured to collimate different color light emitted from a respective underlying light emitting diode (10A, 10B, 10C) within the array of light emitting diodes (10A, 10B, 10C) along a vertical direction that is perpendicular to a top surface of the backplane 400.

According to an aspect of the present disclosure, the array of patterned metamaterial lenses (120A, 120B, 120C) can be patterned from a single metamaterial layer 120L that continuously extends over the entire array of light emitting diodes (10A, 10B, 10C), and may be formed directly on a top surface of the transparent conductive material layer 150 that continuously extends over the entire array of light emitting diodes (10A, 10B, 10C). In one embodiment, each patterned metamaterial lens (120A, 120B, 120C) may comprise a set of non-periodic metamaterial portions (as illustrated in FIGS. 7A-7F) that extend over an area of the respective underlying light emitting diode (10A, 10B, 10C). In one embodiment, the set of non-periodic metamaterial portions has a same thickness.

Light collimation provided by the array of light emitting diodes (10A, 10B, 10C) increases the directionality of the light from the light emitting device. Thus, the array of light emitting diodes (10A, 10B, 10C) can make the light emitting device of the embodiments of the present disclosure are suitable for heads-up displays or for virtual reality applications.

Figure 8:
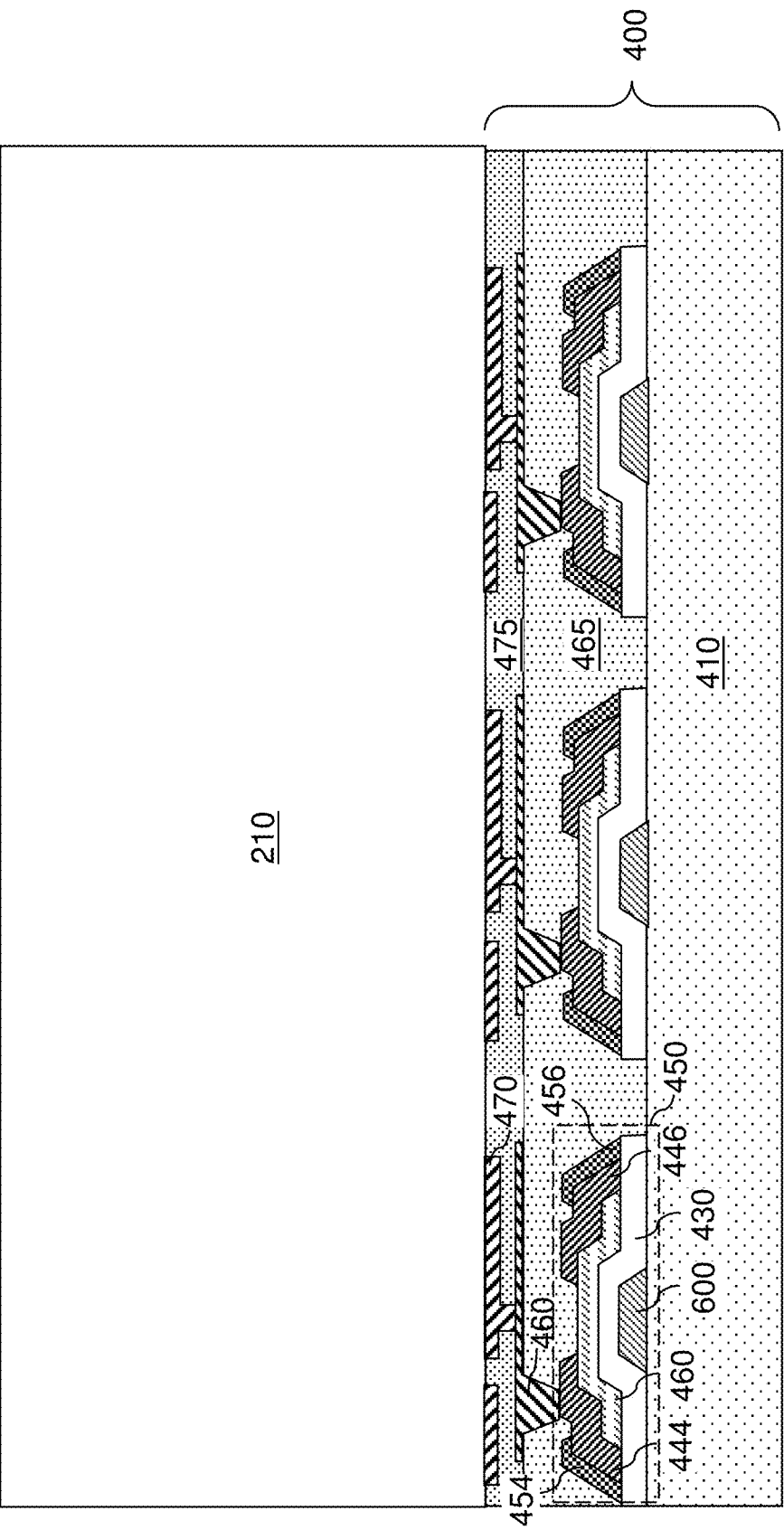
FIG. 8 is a vertical cross-sectional view of a region of a second exemplary structure after formation of a dielectric matrix layer over a backplane according to an embodiment of the present disclosure.

Referring to FIG. 8, a second exemplary structure after according to a second embodiment of the present disclosure can be derived from the first exemplary structure illustrated in FIG. 1 by forming a dielectric matrix layer 210 over the backplane 400. The dielectric matrix layer 210 comprises a dielectric material such as silicon oxide, silicon nitride, a dielectric metal oxide (such as aluminum oxide or titanium oxide), or a polymer material (such as polyimide). The thickness of the dielectric matrix layer 210 may be in a range from 1 micron to 60 microns, such as from 2 microns to 30 microns, although lesser and greater thicknesses may also be employed.

Figure 9:
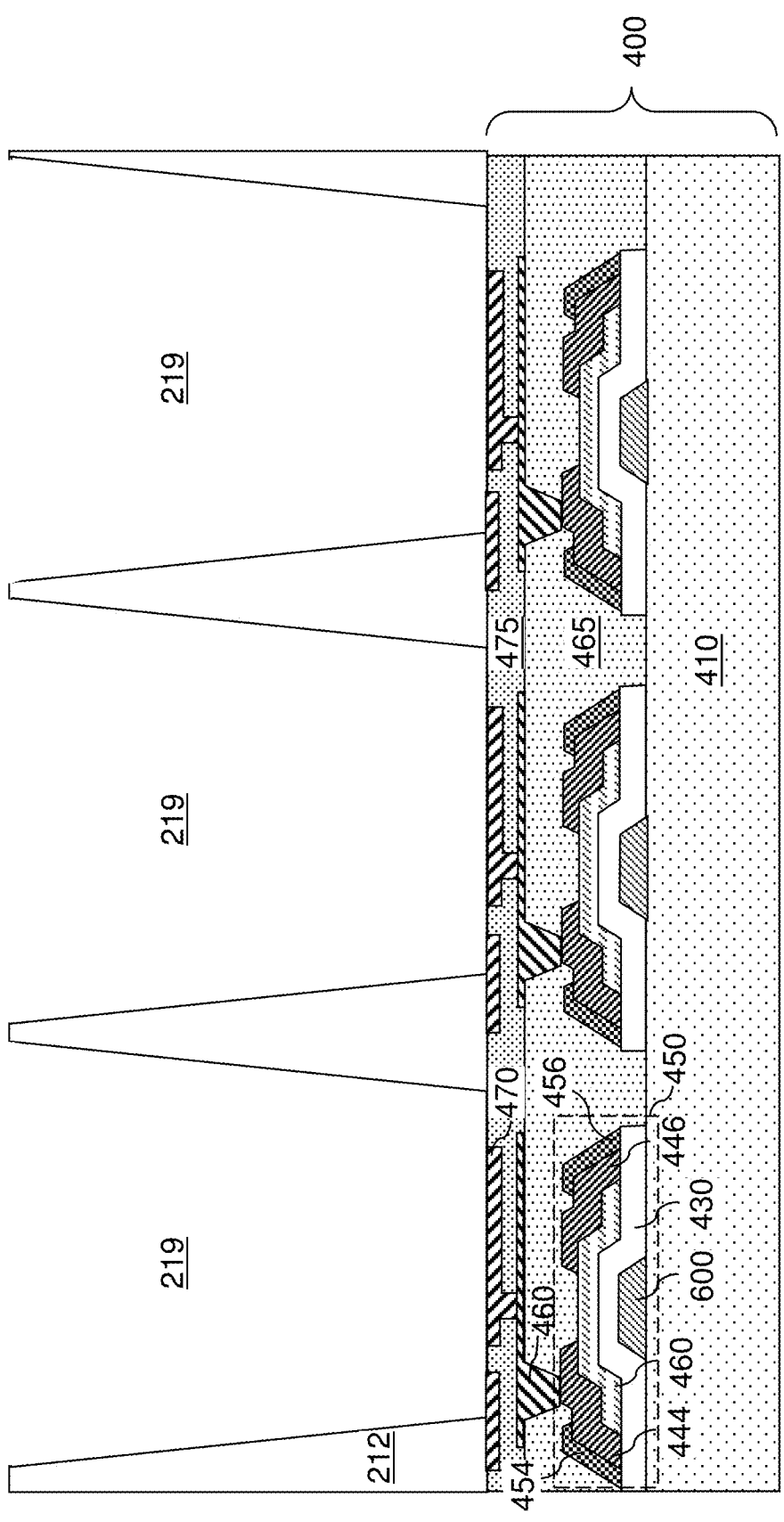
FIG. 9 is a vertical cross-sectional view of a region of the second exemplary structure after formation of an array of cavities through the dielectric matrix layer according to an embodiment of the present disclosure.

Referring to FIG. 9, an array of cavities 219 can be formed through the dielectric matrix layer 210. For example, a photoresist layer (not shown) may be applied over the dielectric matrix layer 210 and can be lithographically patterned to form an array of openings, and an anisotropic etch process may be performed to transfer the pattern of the openings in the photoresist layer into the dielectric matrix layer 210. The photoresist layer can be subsequently removed, for example, by ashing. Alternatively, the dielectric matrix layer 210 may comprise a photosensitive material such as a photosensitive polyimide material. In this case, the material of the dielectric matrix layer 210 may be directly exposed and developed to form the array of cavities 219 therein. The cavities 219 may comprise optical cavities. Remaining portions of the dielectric matrix layer 210 comprise separators 212 which separate adjacent subpixels of a display device and which function of sidewalls of the optical cavities 219.

Each cavity 219 may be located over a respective metallic bonding pad, which may be a respective metal interconnect structure (460, 470) such as a respective second-level metal interconnect structure 470. In one embodiment, a second-level metal interconnect structure 470 may be physically exposed at a center region of the bottom of each cavity 219, and another second-level metal interconnect structure 470 may be physically exposed at a peripheral portion of the bottom of each cavity 219. In one embodiment, the cavities 219 may be formed with a taper angle in a range from 0.1 degree to 30 degrees, such as from 1 degree to 10 degrees so that the upper portion of each cavity 219 has a greater lateral dimension than the lower portion of each cavity 219.

Figure 10:
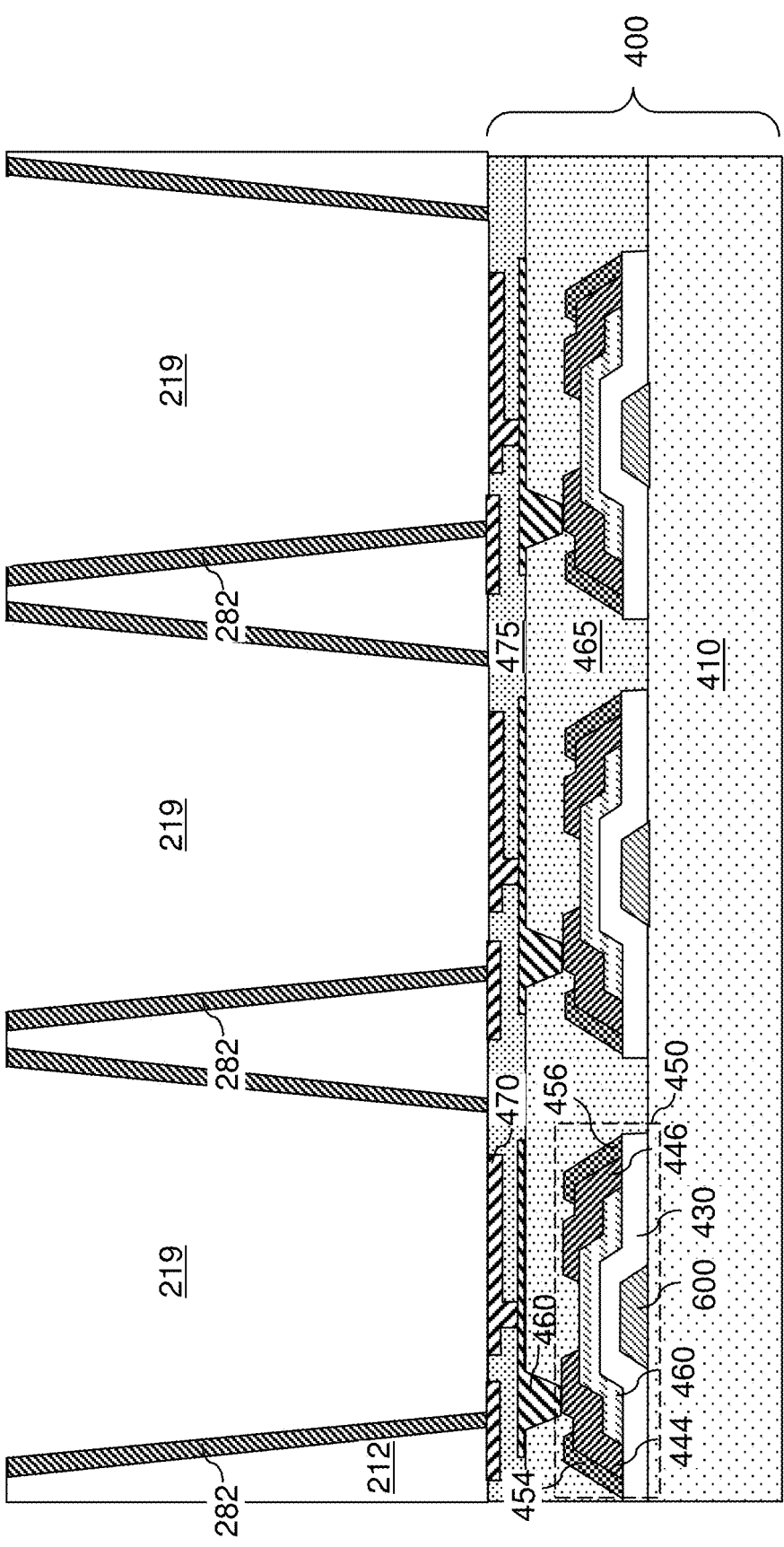
FIG. 10 is a vertical cross-sectional view of a region of the second exemplary structure after formation of an array of reflectors according to an embodiment of the present disclosure.

Referring to FIG. 10, a reflective material layer (such as a metal layer) can be conformally deposited in the cavities 219. A reactive ion etch process can be performed to remove horizontally-extending portions of the reflective material layer. Remaining tubular portions of the reflective material layer comprise reflectors 282. Alternatively, a photoresist layer (not shown) can be applied over the reflective material layer, and can be lithographically patterned to cover vertically-extending portions of the reflective material layer. An etch process, such as an anisotropic etch process, can be performed to remove unmasked portions of the reflective material layer. Remaining portions of the reflective material layer comprise reflectors 282.

The reflectors 282 comprise a reflective material. For example, the reflectors 282 may comprise a metal, such as aluminum, silver, gold, or copper. The reflectors 282 may have a thickness in a range from 10 nm to 300 nm, such as from 30 nm to 100 nm, although lesser and greater thicknesses may also be employed. In one embodiment, each reflector 282 may have a configuration of a megaphone-shaped tube. In one embodiment, a bottom surface of each reflector 282 may contact a respective metal interconnect structure (such as a second-level metal interconnect structure 470), and a metal interconnect structure (such as another second-level metal interconnect structure 470) may be physically exposed at a center region of the bottom of each cavity 219. Generally, an array of reflectors 282 can be formed in the array of cavities 219. Each reflector 282 may be formed directly on sidewalls (i.e., the separator 212 sidewalls) of a respective cavity 219.

Alternatively, the separators 212 (with or without the reflectors 282) may be formed separately and then attached to the backplane 400. In another embodiment, the separators 212 may be formed of a reflective (e.g., metal) material. In that case, the sidewalls of the separators 212 function as the reflectors 282.

Figure 11:
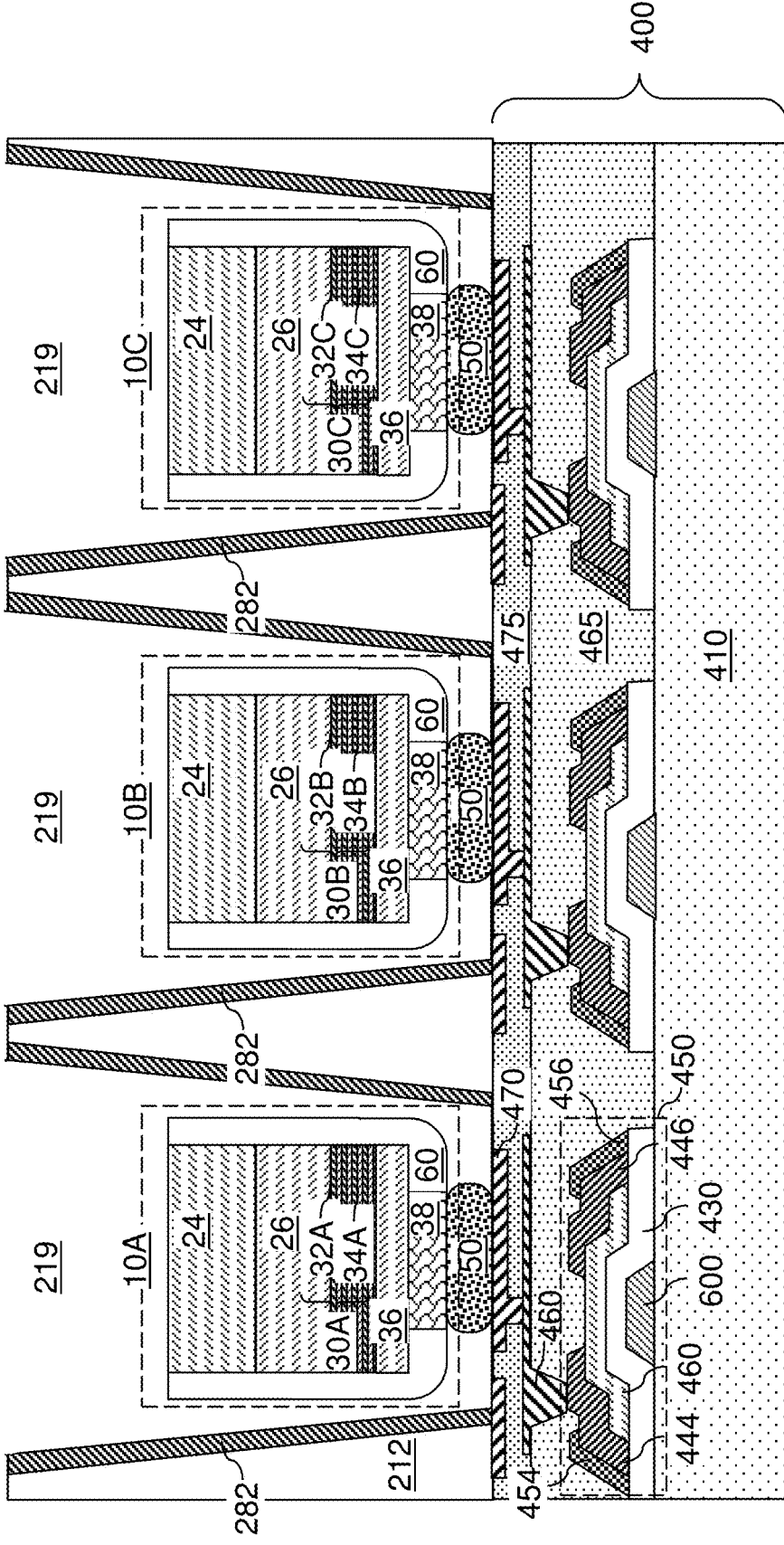
FIG. 11 is a vertical cross-sectional view of a region of the second exemplary structure after attaching an array of light emitting diodes to the backplane according an embodiment of the present disclosure.

Referring to FIG. 11, light emitting diodes (10A, 10B, 10C) may be attached to a respective first metal interconnect structure (such as a respective second-level metal interconnect structure 470) through an array of solder material portions 50. The light emitting diodes (10A, 10B, 10C) employed in the second exemplary structure may be the same as the light emitting diodes (10A, 10B, 10C) employed in the first exemplary structure, or may be different from the light emitting diodes (10A, 10B, 10C) employed in the first exemplary structure by the absence of the reflectors 82. In other words, the reflectors 82 may, or may not, be present in the light emitting diodes (10A, 10B, 10C) in the second exemplary structure.

An array of first light emitting diodes 10A can be attached to a first subset of the metal interconnect structures (460,

470) (such as metal bonding pads) in the backplane 400. The first light emitting diodes 10A can be configured to emit light at a first peak wavelength, which may be, for example a blue light having a wavelength range between 620 nm to 750 nm.

An array of second light emitting diodes 10B can be attached to a second subset of the metal interconnect structures (460, 470) (such as metal bonding pads) in the backplane 400. The second light emitting diodes 10B can be configured to emit light at a second peak wavelength, which may be, for example a green light having a wavelength range between 530 nm to 570 nm.

An array of third light emitting diodes 10C can be attached to a third subset of the metal interconnect structures (460, 470) (such as metal bonding pads) in the backplane 400. The third light emitting diodes 10C can be configured to emit light at a third peak wavelength, which may be, for example a blue light having a wavelength range between 420 nm to 480 nm.

Generally, an array of light emitting diodes (10A, 10B, 10C) can be attached to the backplane 400. In one embodiment, the array of light emitting diodes (10A, 10B, 10C) comprises a first sub-array of first light emitting diodes 10A configured to emit light at a first peak wavelength, a second sub-array of second light emitting diodes 10B configured to emit light at a second peak wavelength, and a third sub-array of third light emitting diodes 10C configured to emit light at a third peak wavelength. The first peak wavelength, the second peak wavelength, and the third peak wavelength are different from each other.

Figure 12:
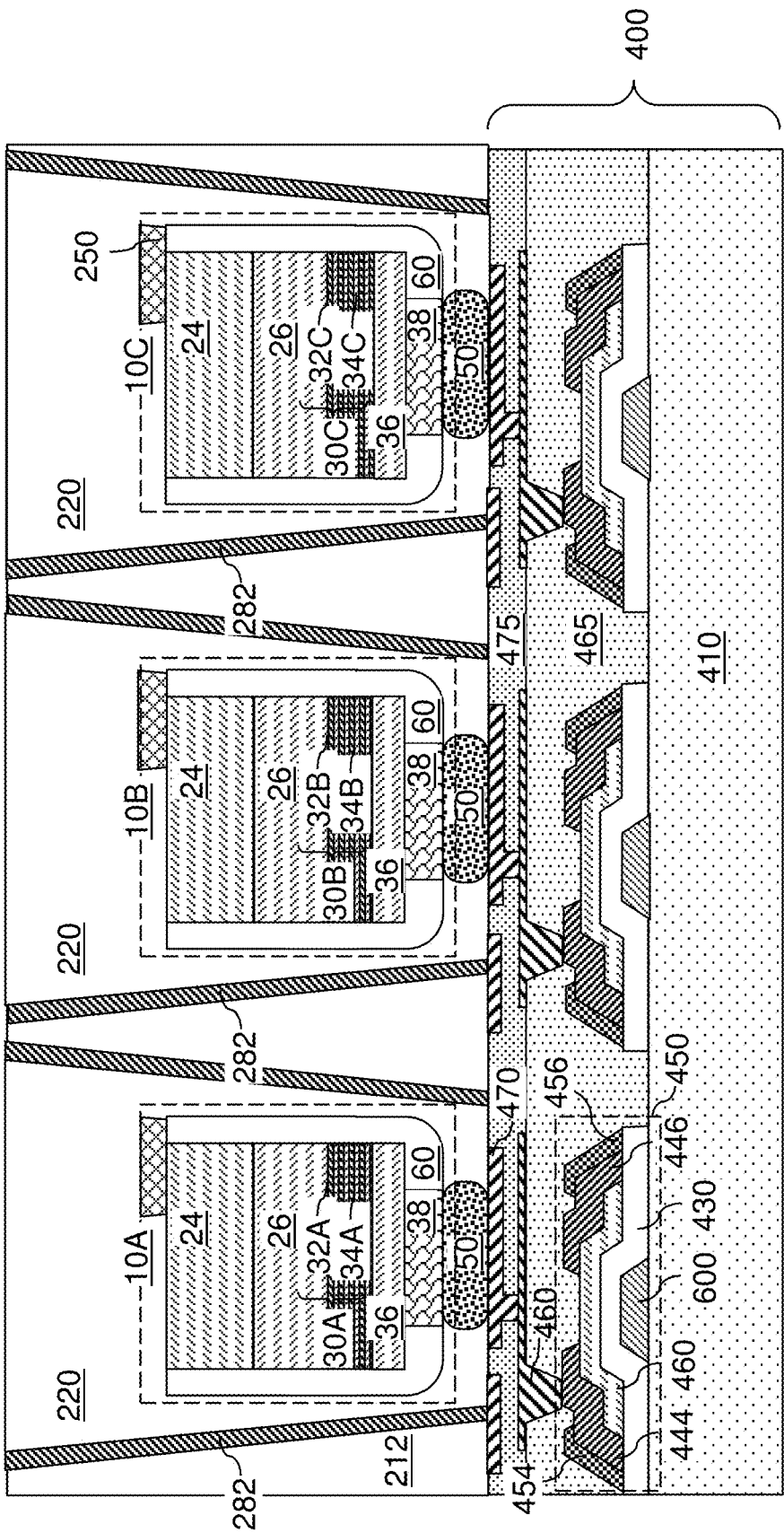
FIG. 12 is a vertical cross-sectional view of a region of the second exemplary structure after formation of cavity-fill dielectric material portion according an embodiment of the present disclosure.

Referring to FIG. 12, n-side electrodes 250 may be formed within each cavity 219 to provide electrical connection between each first doped compound semiconductor layer 26 and the backplane 400. The electrical connection may be located out of the plane of the drawing in FIG. 12.

A cavity-fill dielectric material can be deposited in remaining volumes of the cavities 219. The cavity-fill dielectric material comprises an optically transparent dielectric material such as silicon oxide, silicon nitride, or an optically transparent polymer material. Excess portions of the cavity-fill dielectric material can be removed from above the horizontal plane including the top surface of the separators 212 by a planarization process, such as a chemical mechanical polishing process. An array of cavity-fill dielectric material portions 220 can be formed in the array of cavities 219 over the array of light emitting diodes (10A, 10B, 10C).

Figure 13:
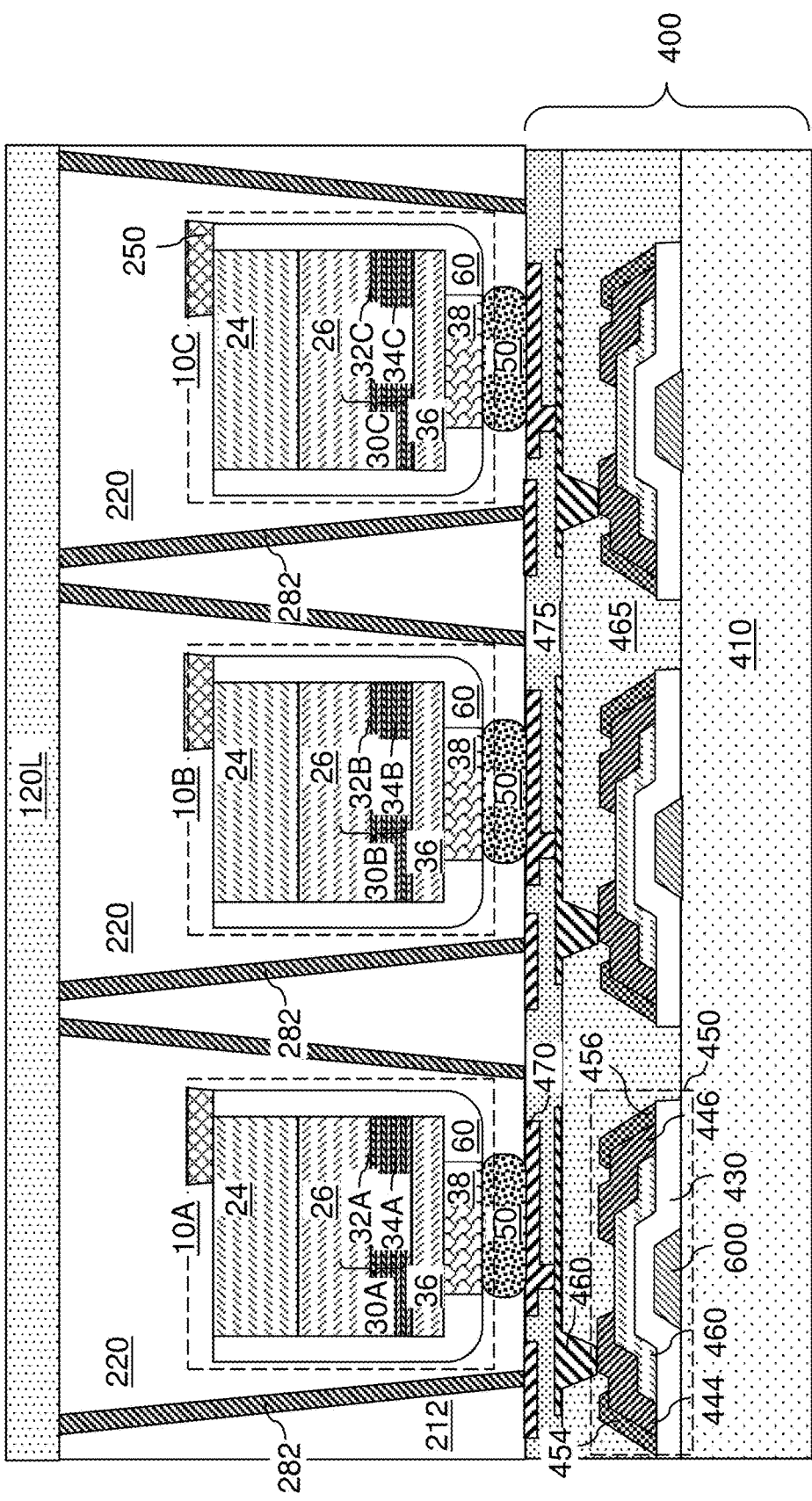
FIG. 13 is a vertical cross-sectional view of the second exemplary structure after forming a metamaterial layer on a front side of the array of light emitting diodes according to an embodiment of the present disclosure.

Referring to FIG. 13, a metamaterial layer 120L can be deposited over the cavity-fill dielectric material portions 220 and the front side of the array of light emitting diodes (10A, 10B, 10C). In embodiment, the metamaterial layer 120L can be deposited directly on distal horizontal surfaces of the separators 212. For example, the metamaterial layer 120L may be deposited over the separators 212, the array of reflectors 282, the cavity-fill dielectric material portions 220 and the array of light emitting diodes (10A, 10B, 10C).

Figure 14:
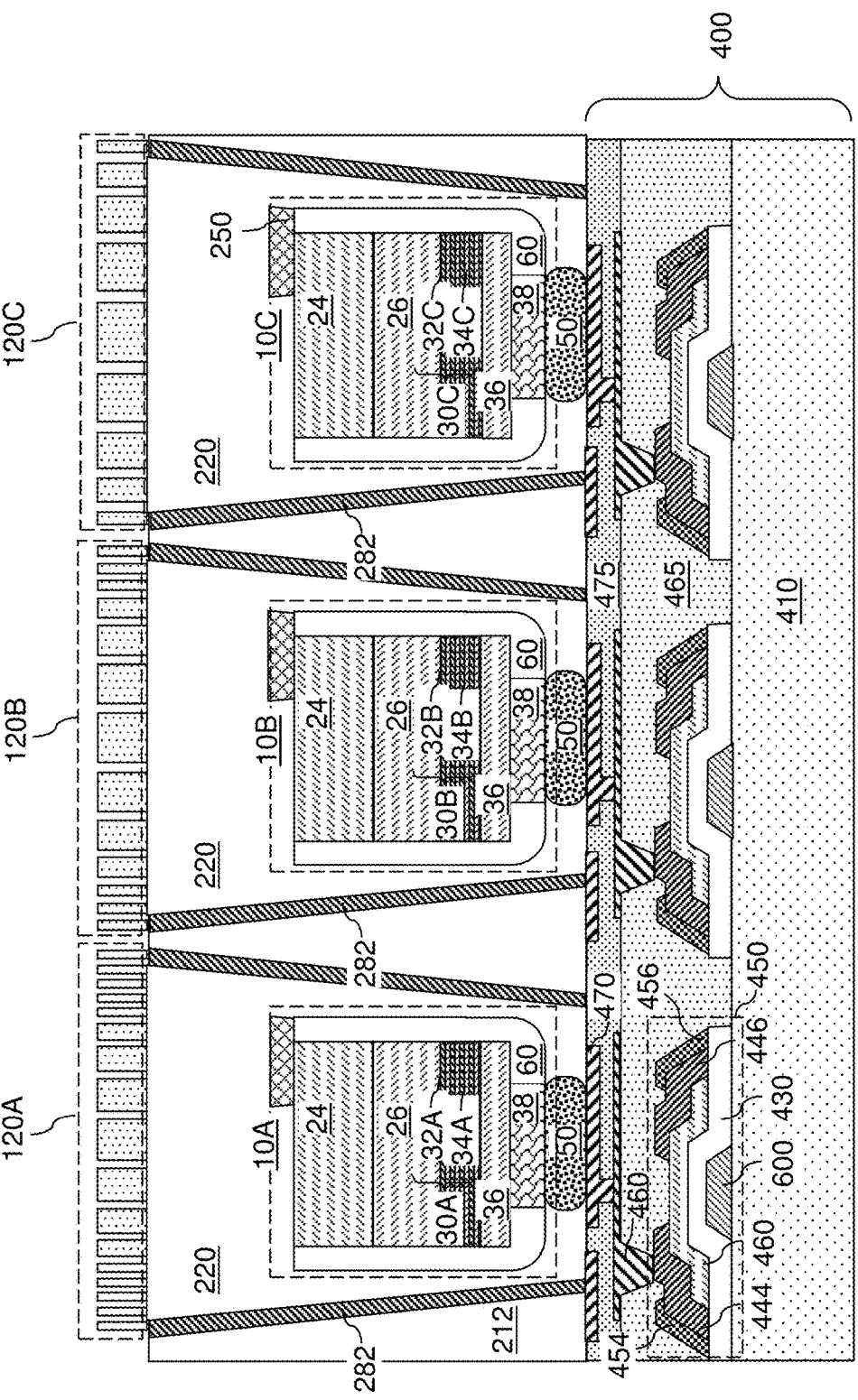
FIG. 14 is a vertical cross-sectional view of the second exemplary structure after patterning the metamaterial layer into an array of patterned metamaterial lenses according to an embodiment of the present disclosure.

Referring to FIG. 14, the metamaterial layer 120L can be patterned into an array of patterned metamaterial lenses (120A, 120B, 120C). The same patterning process employed to pattern the metamaterial layer 120L into the array of patterned metamaterial lenses (120A, 120B, 120C) in the first exemplary structure may be employed to pattern the metamaterial layer 120L into the array of patterned metamaterial lenses (120A, 120B, 120C) in the second exemplary structure.

Each patterned metamaterial lens (120A, 120B, 120C) can have a pattern that collimates light that is emitted from a respective underlying light emitting diode (10A, 10B,

10C). First patterned metamaterial lenses 120A can be formed over first light emitting diodes 10A that emit light at the first peak wavelength, and can have a pattern that collimates light having the first peak wavelength with highest directionality. Second patterned metamaterial lenses 120A can be formed over second light emitting diodes 10B that emit light at the second peak wavelength, and can have a pattern that collimates light having the second peak wavelength with highest directionality. Third patterned metamaterial lenses 120A can be formed over third light emitting diodes 10C that emit light at the third peak wavelength, and can have a pattern that collimates light having the third peak wavelength with highest directionality.

Generally, each patterned metamaterial lens (120A, 120B, 120C) within the array of patterned metamaterial lenses (120A, 120B, 120C) can be configured to collimate light emitted from a respective underlying light emitting diode (10A, 10B, 10C) within the array of light emitting diodes (10A, 10B, 10C) along a vertical direction that is perpendicular to a top surface of the backplane 400. As discussed above, the configuration, such as size (e.g., width and/or length), spacing and/or direction (i.e., positional angle), of the nanostructures in the first patterned metamaterial lenses 120A may differ from the configuration of the second patterned metamaterial lenses 120B, and the configuration of the third patterned metamaterial lenses may different from the configurations of the first and the second patterned metamaterial lenses (120A, 120B).

In one embodiment, the array of patterned metamaterial lenses (120A, 120B, 120C) can be in contact with a top surface of the separators 212, and can be vertically spaced from the array of light emitting diodes (10A, 10B, 10C). In one embodiment, each of the patterned metamaterial lenses (120A, 120B, 120C) can be located directly on a respective cavity-fill dielectric material portion 220 within the array of cavity-fill dielectric material portions 220.

Figure 15:
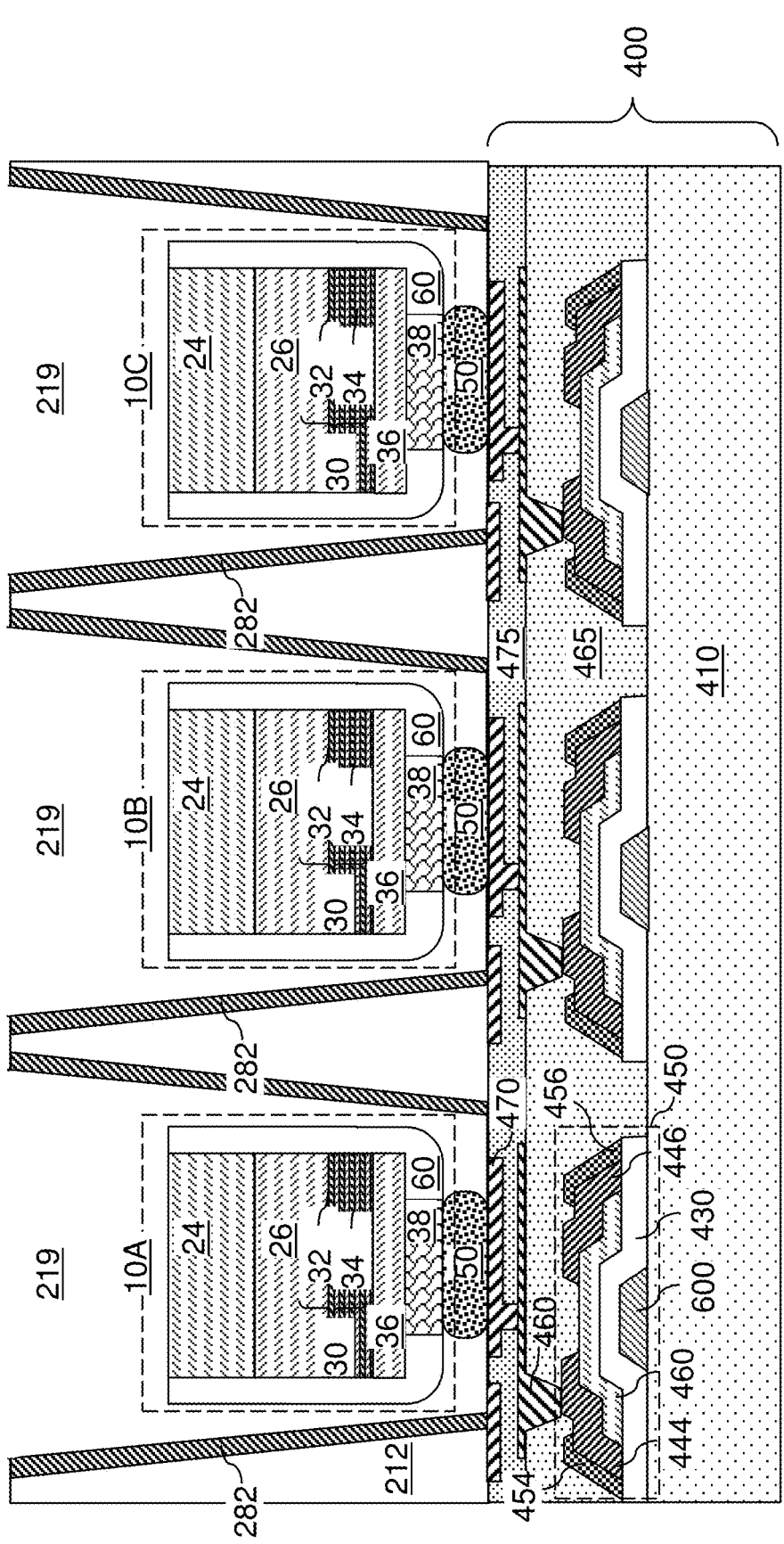
FIG. 15 is a vertical cross-sectional view of a region of a third exemplary structure after attaching an array of light emitting diodes to the backplane according an embodiment of the present disclosure.

Referring to FIG. 15, a third exemplary structure according to a third embodiment of the present disclosure can be derived from the second exemplary structure of FIG. 10 by attaching light emitting diodes 10 to the metallic bonding pads (which are a subset of the metal interconnect structures (460, 470)) of the backplane 400.

According to the third embodiment, each of the light emitting diodes 10 may have the same structure, and thus, may be configured to emit radiation at a same peak wavelength, which may be an ultraviolet wavelength or a blue wavelength (which includes blue and violet light). Each light emitting diode 10 may comprise a buffer layer 24, a first doped compound semiconductor layer 26, an active layer 30, a second doped compound semiconductor portion 36, and an insulating spacer 60, and may optionally comprise a reflector (not shown). Each active layer 30 includes a set of doped compound semiconductor material layers that is configured to emit radiation at a peak wavelength. In one embodiment, the active layer 30 may comprise a periodic repetition of first compound semiconductor layers 32 and second compound semiconductor layers 34 that forms a quantum well. The material compositions and the thicknesses of the first compound semiconductor layers 32 and second compound semiconductor layers 34 can be selected such that the active layer 30 emits radiation at the peak wavelength, which may be an ultraviolet wavelength or a blue wavelength. Additional material layers configured to increase the quantum efficiency of the light emission may be present within the active layer 30. Alternatively, non-quantum-well structures may be employed for the active layer 30. Generally, the active layer 30 may comprise any set of doped compound semiconductor material layers that is configured to emit radiation at the peak wavelength.

The light emitting diodes 10 can be attached to the backplane 400 employing the same methods as the methods of attaching the light emitting diodes (10A, 10B, 10C) of the second exemplary structure as described with reference to FIG. 11.

Figure 16:
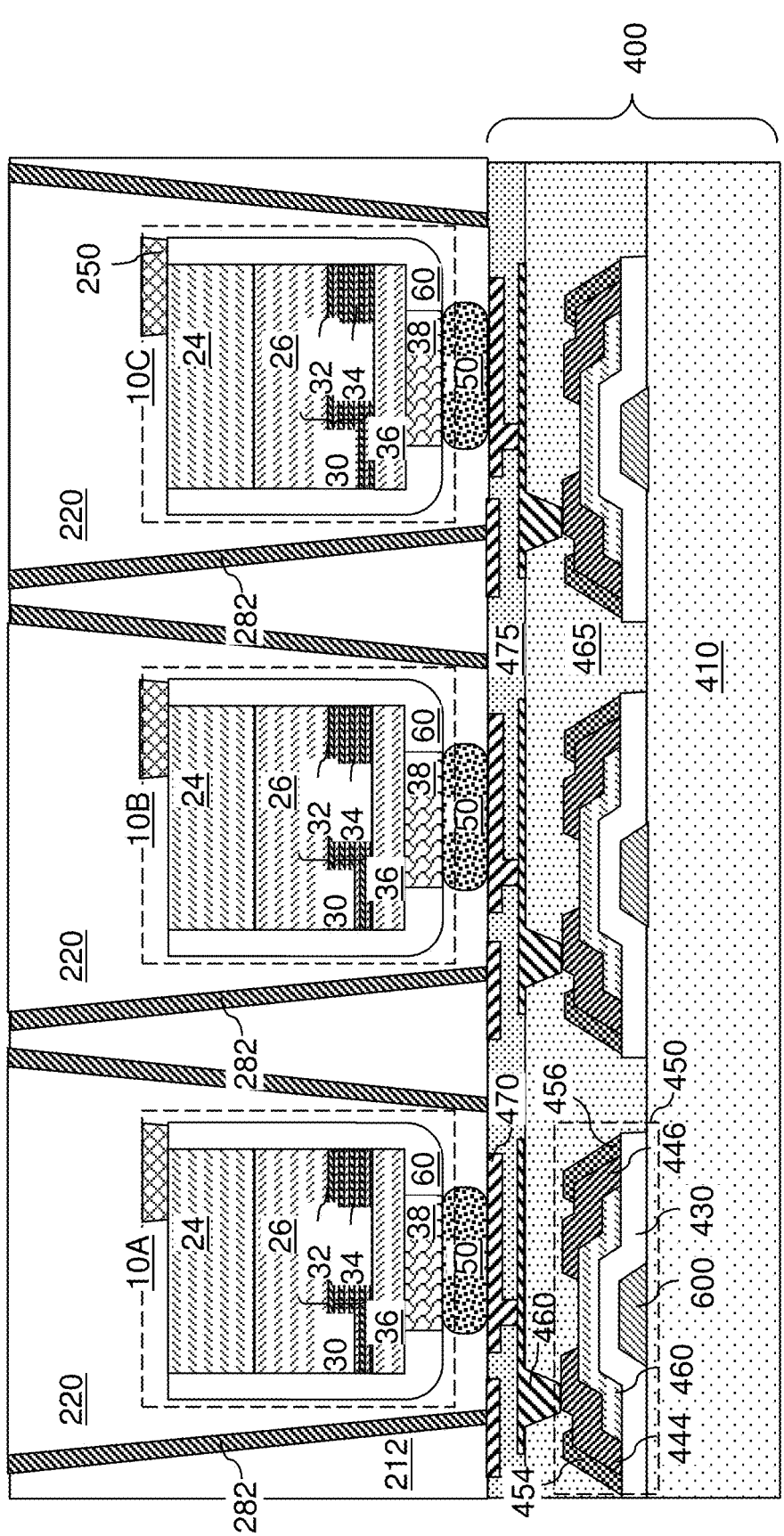
FIG. 16 is a vertical cross-sectional view of a region of the third exemplary structure after formation of cavity-fill dielectric material portion according an embodiment of the present disclosure.

Referring to FIG. 16, n-side electrodes 250 and an array of cavity-fill dielectric material portions 220 can be formed by performing the processing steps described with reference to FIG. 12.

Figure 17:
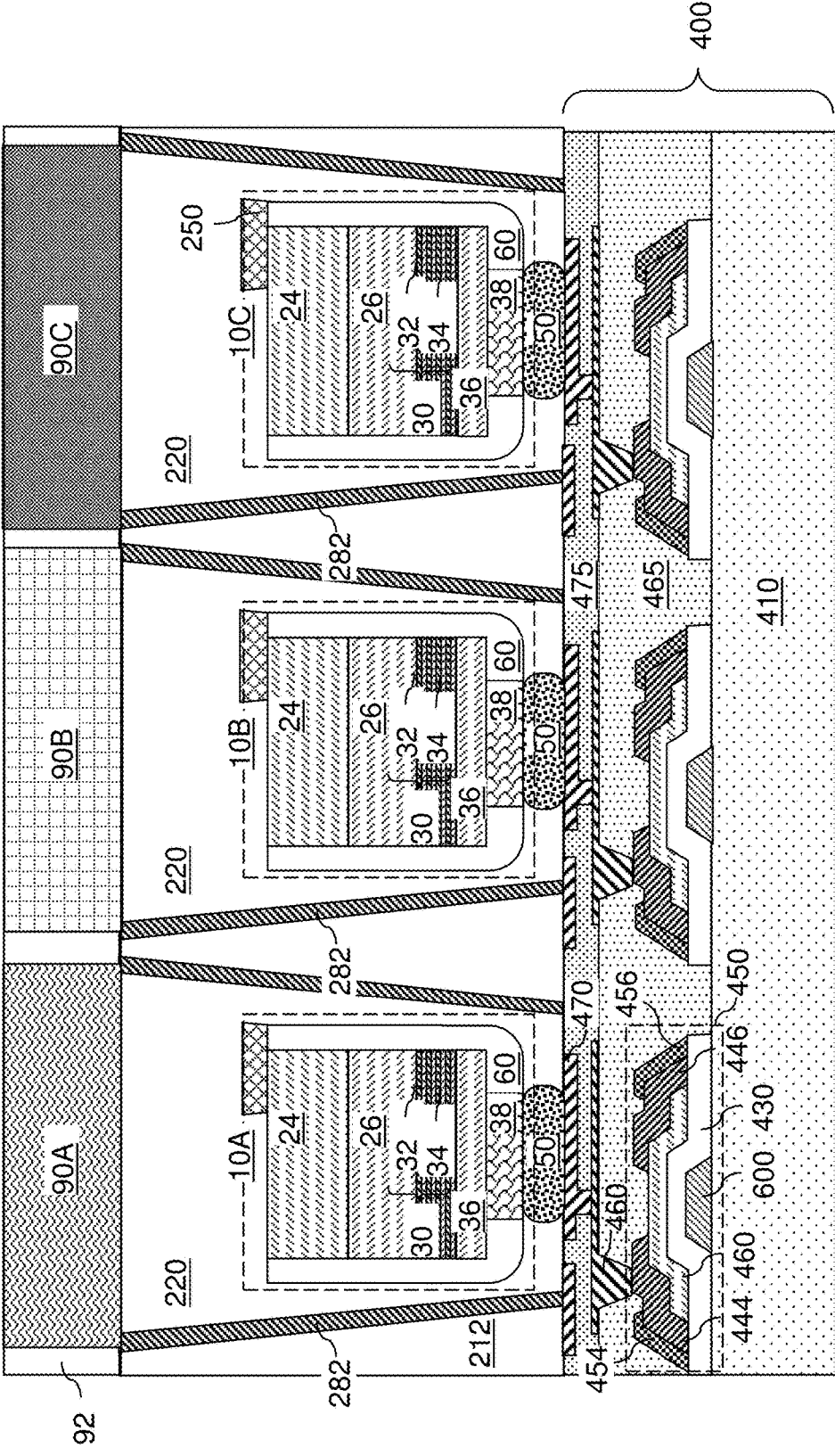
FIG. 17 is a vertical cross-sectional view of a region of the third exemplary structure after formation of an array of color conversion medium portions according an embodiment of the present disclosure.

Referring to FIG. 17, arrays of color conversion medium portions (90A, 90B, 90C) can be formed over, and optionally directly on, the separators 212, the array of reflectors 282, and the array of cavity-fill dielectric material portions 220. Each color conversion medium portion (90A, 90B, 90C) can be formed above, and can have an areal overlap in a plan view with, a respective underlying light emitting diode 10. Each color conversion medium portion (90A, 90B, 90C) comprises a material that converts incident radiation into an emission light having a different wavelength than the incident light. For example, the incident radiation as emitted by the active layers 30 of the light emitting diodes 10 may be a blue light or an ultraviolet radiation, and the emission light that is emitted from the color conversion medium portions (90A, 90B, 90C) may be light having a longer wavelength than the incident radiation. For example, the color conversion medium portions (90A, 90B, 90C) may comprise quantum dots, phosphors, dyes or any material that emits light upon excitation by the incident light. In an illustrative example, the emission light from the color conversion medium portions (90A, 90B, 90C) may comprise a red light, a green light, and a blue light, respectively.

In one embodiment, the arrays of color conversion medium portions (90A, 90B, 90C) may comprise first color conversion medium portions 90A overlying a first subset of the light emitting diodes 10 within the array of the light emitting diodes 10 and configured to convert incident light into a first emission light having a first peak wavelength (such as red light), second color conversion medium portions 90B overlying a second subset of the light emitting diodes 10 within the array of the light emitting diodes 10 and configured to convert incident light into a second emission light having a second peak wavelength (such as green light), and third color conversion medium portions 90C overlying a third subset of the light emitting diodes 10 within the array of the light emitting diodes 10 and configured to convert incident light into a third emission light having a third peak wavelength (such as blue light). In one embodiment, the first peak wavelength, the second peak wavelength, and the third peak wavelength are different among one another. A conversion-level frame 92 may be optionally formed between neighboring pairs of color conversion medium portions (90A, 90B, 90C) of the arrays of color conversion medium portions (90A, 90B, 90C). The conversion-level frame 92M may comprise a reflective material, such as aluminum, silver, gold, or copper.

Figure 18:
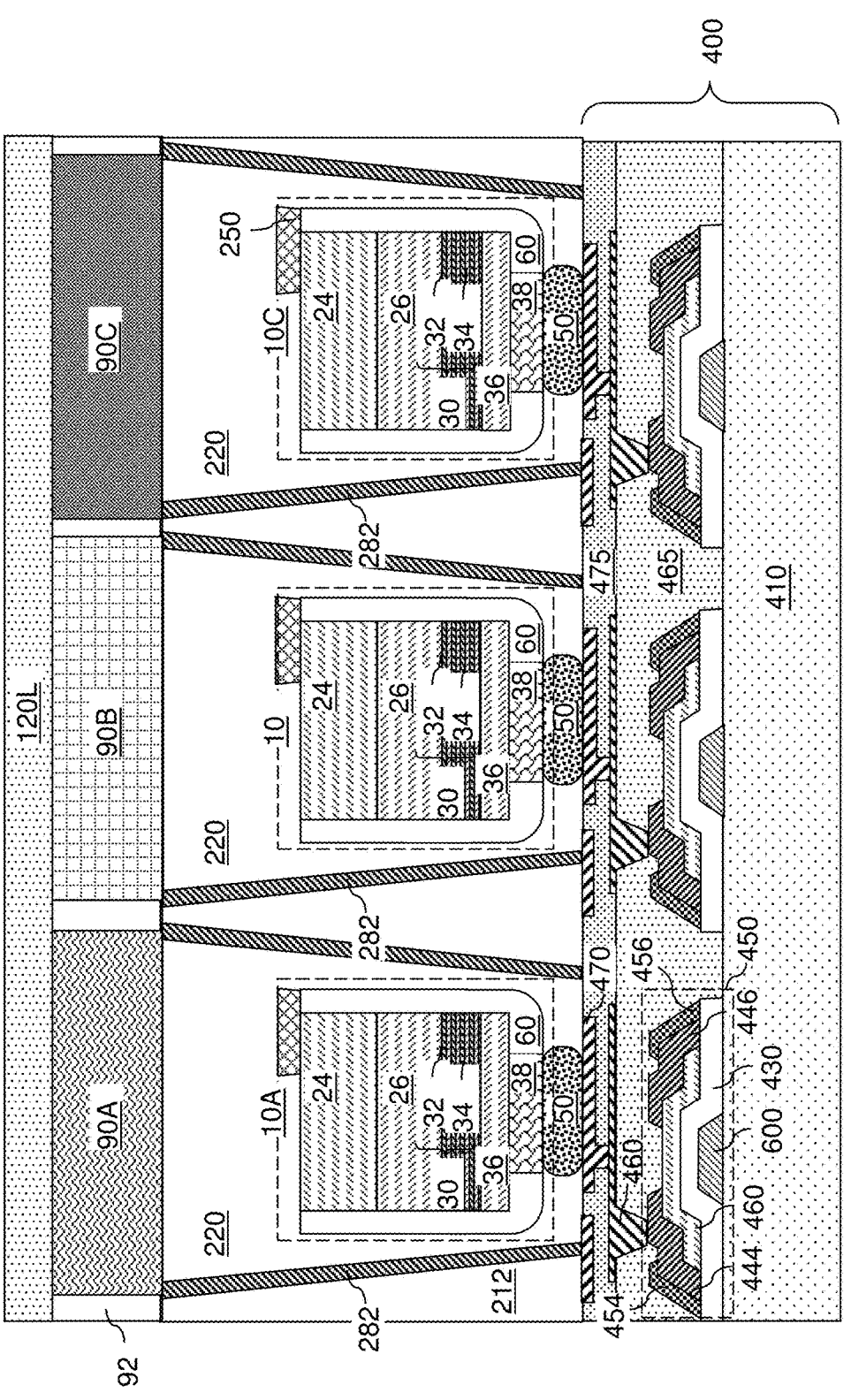
FIG. 18 is a vertical cross-sectional view of the third exemplary structure after forming a metamaterial layer on a front side of the array of light emitting diodes according to an embodiment of the present disclosure.

Referring to FIG. 18, the above described metamaterial layer 120L can be deposited on the distal horizontal surfaces of the arrays of color conversion medium portions (90A, 90B, 90C). The metamaterial layer 120L is deposited over and is vertically spaced from the separators 212, the array of reflectors 282, and the array of light emitting diodes (10A, 10B, 10C) by the arrays of color conversion medium portions (90A, 90B, 90C).

Figure 19:
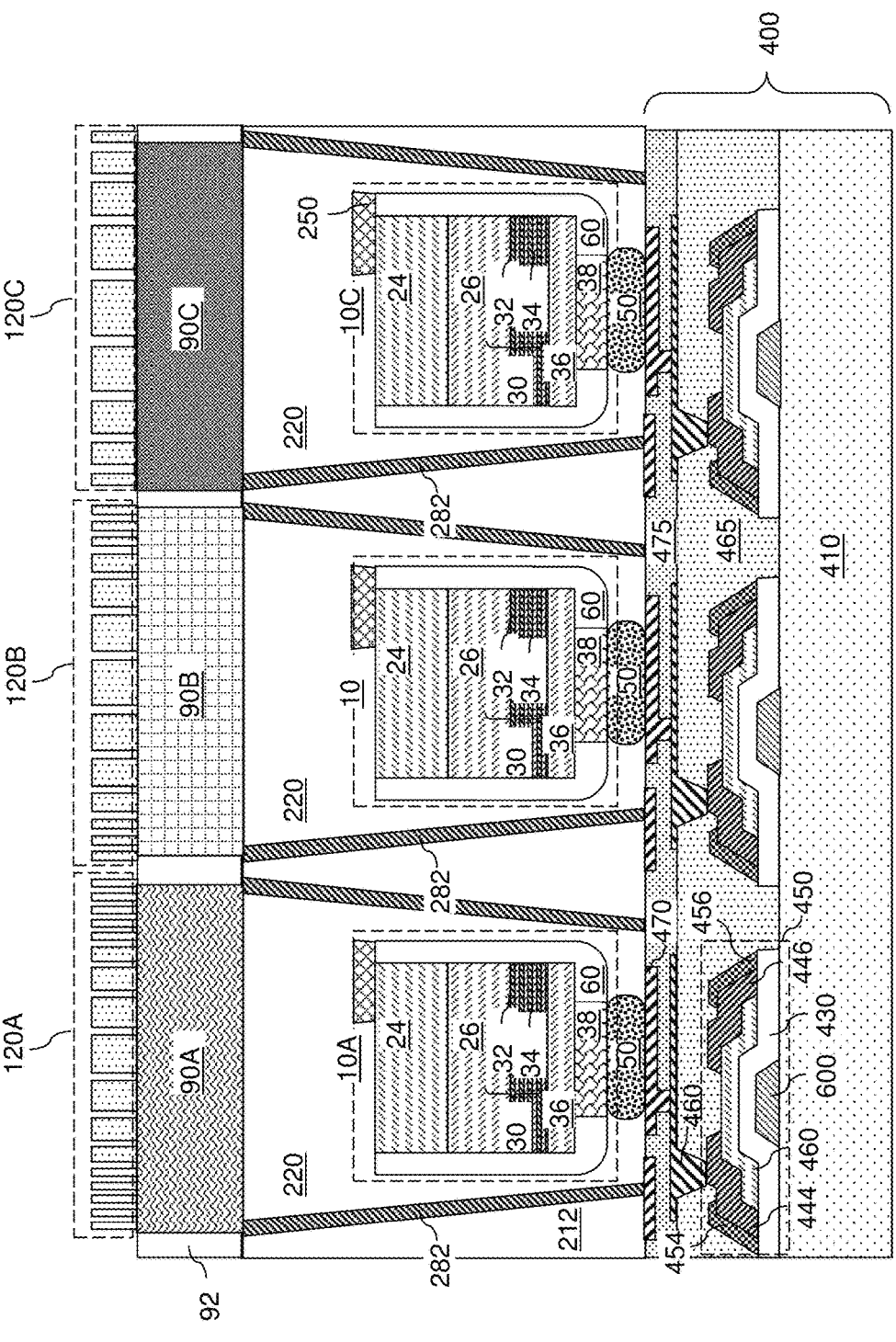
FIG. 19 is a vertical cross-sectional view of the third exemplary structure after patterning the metamaterial layer into an array of patterned metamaterial lenses according to an embodiment of the present disclosure.

Referring to FIG. 19, the metamaterial layer 120L can be patterned into an array of patterned metamaterial lenses (120A, 120B, 120C). The same patterning process employed to pattern the metamaterial layer 120L into the array of patterned metamaterial lenses (120A, 120B, 120C) in the first exemplary structure may be employed to pattern the metamaterial layer 120L into the array of patterned metamaterial lenses (120A, 120B, 120C) in the third exemplary structure.

Each patterned metamaterial lens (120A, 120B, 120C) can have a pattern that collimates radiation that is emitted from a respective underlying light emitting diode 10 and passes through a respective color conversion medium portion (90A, 90B, 90C). Radiation emitted from a first subset of the light emitting diodes 10 and then down converted to longer wavelength light as it passes through the first color conversion medium portion 90A may have a first peak wavelength. First patterned metamaterial lenses 120A can be formed over the first color conversion medium portions 90A that emit light at the first peak wavelength, and can have a pattern that collimates light having the first peak wavelength with highest directionality. Radiation emitted from a second subset of the light emitting diodes 10 and then down converted to longer wavelength light as it passes through passes through a second color conversion medium portion 90B may have a second peak wavelength. Second patterned metamaterial lenses 120B can be formed over the second color conversion medium portions 90B that emit light at the second peak wavelength, and can have a pattern that collimates light having the second peak wavelength with highest directionality. Radiation emitted from a third subset of the light emitting diodes 10 and then down converted to longer wavelength light as it passes through passes through a third color conversion medium portion 90C may have a third peak wavelength. Third patterned metamaterial lenses 120C can be formed over third color conversion medium portions 90C that emit light at the third peak wavelength, and can have a pattern that collimates light having the third peak wavelength with highest directionality.

Generally, each patterned metamaterial lens (120A, 120B, 120C) within the array of patterned metamaterial lenses (120A, 120B, 120C) can be configured to collimate light provided respective underlying color conversion medium portion (90A, 90B, 90C) along a vertical direction that is perpendicular to a top surface of the backplane 400.

The configuration, such as size (e.g., width and/or length), spacing and/or direction (i.e., positional angle), of the nanostructures in the first patterned metamaterial lenses 120A may differ from the configuration of the second patterned metamaterial lenses 120B, and the configuration of the third patterned metamaterial lenses may different from the configurations of the first and the second patterned metamaterial lenses (120A, 120B). For example, if the first color conversion medium portions 90A emit red light, then the configuration of the first patterned metamaterial lenses 120A may be configured to optimize collimation of red light. Likewise, if the second and third color conversion medium portions (90B, 90C) emit green and blue light, respectively, then the configuration of the second patterned metamaterial lenses (120B, 120C) may be configured to optimize collimation of green and blue light, respectively.

In one embodiment, the array of patterned metamaterial lenses (120A, 120B, 120C) can be in contact with top surfaces of the color conversion medium portions (90A, 90B, 90C), and can be vertically spaced from the array of light emitting diodes (10A, 10B, 10C). In one embodiment, each of the patterned metamaterial lenses (120A, 120B, 120C) can be located directly on a respective color conversion medium portion (90A, 90B, 90C) within the array of color conversion medium portions (90A, 90B, 90C). In one embodiment, each patterned metamaterial lens (120A, 120B, 120C) within the array of patterned metamaterial lenses (120A, 120B, 120C) is located directly on a respective color conversion medium portion (90A, 90B, or 90C) selected from the first color conversion medium portions 90A, the second color conversion medium portions 90B, and the third color conversion medium portions 90C.

Referring to all drawings and according to various embodiments of the present disclosure, a light emitting device includes a backplane 400, first, second and third light emitting diodes {10 or (10A, 10B, 10C)} located on the backplane, a first patterned metamaterial lens 120A containing first nanostructures located over the first light emitting diode, a second patterned metamaterial lens 120B containing second nanostructures located over the second light emitting diode, and a third patterned metamaterial lens 120C containing third nanostructures located over the light emitting diode. A configuration of the first nanostructures differs from a configuration of the second nanostructures, and a configuration of the third nanostructures differs from the configurations of the first and the second nanostructures.

In one embodiment, the configuration of the first nanostructures differs from the configuration of the second nanostructures by at least one of size, spacing or direction, and the configuration of the third nanostructures differs from the configurations of the first and the second nanostructures by at least one of size, spacing or direction. In one embodiment, the first nanostructures have a different size than the second nanostructures, and the third nanostructures have a different size than the second nanostructures.

In the first and second embodiments, the first light emitting diode 10A is configured to emit red light, the second light emitting diode 10B is configured to emit green light, and the third light emitting diode 10C is configured to emit blue light. The first patterned metamaterial lens 120A is configured to optimize collimation of red light, the second patterned metamaterial lens 120B is configured to optimize collimation of green light, and the third patterned metamaterial lens 120C is configured to optimize collimation of blue light.

In the first embodiment, a dielectric matrix layer 110 laterally surrounds the first, second and third light emitting diodes (10A, 10B, 10C).

In the second embodiment, separators 212 surround optical cavities 219. The first, second and third light emitting diodes (10A, 10B, 10C) are located in respective optical cavities 219. Reflectors 282 located are on sidewalls of the separators 212. Cavity-fill dielectric material portions 220 are located within the optical cavities 219, and overlying the first, second and third light emitting diodes (10A, 10B, 10C). The first, second and third patterned metamaterial lenses (120A, 120B, 120C) overly a distal surface of the cavity-fill dielectric material portions 220. Each of the first, second and third light emitting diodes (10A, 10B, 10C) comprises a vertical stack including a first doped compound semiconductor layer 26 of a first conductivity type, a second doped compound semiconductor layer 36 of a second conductivity type, and an active layer (30A, 30B, 30C) configured to emit light at a respective peak wavelength located between the first and the second compound semiconductor layers (26, 36).

In the third embodiment, each of the first, second and third light emitting diodes 10 is configured to emit incident radiation having the same peak wavelength. The incident radiation may comprise ultraviolet radiation or blue light.

In the third embodiment, a first color conversion medium portion 90A overlies the first light emitting diode, and configured to convert the incident radiation into a first emission light having a first peak wavelength, a second color conversion medium portion 90B overlies the second light emitting diode, and configured to convert the incident radiation into a second emission light having a second peak wavelength, and a third color conversion medium portion 90C overlies the third light emitting diode, and configured to convert the incident radiation into a third emission light having a third peak wavelength. The first peak wavelength, the second peak wavelength, and the third peak wavelength are different from each other. The first, second and third color conversion medium portions (90A, 90B, 90C) may comprise quantum dots having a different size (e.g., diameter) from each other.

The first patterned metamaterial lens 120A is located above the first light emitting diode (and over portion 90A), the second patterned metamaterial lens 120B is located above the second light emitting diode (and over portion 90B); and the third patterned metamaterial lens 120C is located above the third light emitting diode (and over portion 90C).

In one aspect of the third embodiment, the first emission light comprises red light, the second emission light comprises green light, and the third emission light comprises blue light. The first patterned metamaterial lens 120A is configured to optimize collimation of red light, the second patterned metamaterial lens 120B is configured to optimize collimation of green light, and the third patterned metamaterial lens 120C is configured to optimize collimation of blue light.

In one embodiment, the light emitting device comprises a display device. The first light emitting diode (10 or 10A) and the first patterned metamaterial lens 120 are located in a first subpixel of a pixel "P" of the display device, the second light emitting diode (10 or 10B) and the second patterned metamaterial lens 120B are located in a second subpixel of the pixel of the display device, and the third light emitting diode (10 or 10C) and the third patterned metamaterial lens 120C are located in a third subpixel of the pixel of the display device. The display device may comprise a heads up display device, a virtual reality display device, or an artificial reality display device.

The various embodiments of the present disclosure can be employed to provide a light emitting device having enhanced light collimation along a forward direction for different colors of light. In one embodiment, a metamaterial layer 120L can be deposited in a single deposition step, and can be patterned into an array of patterned metamaterial lenses (120A, 120B, 120C) having different collimation characteristics (i.e., optimized for different wavelengths) employing a same set of lithographic patterning steps and a same set of pattern transfer steps. In this embodiment, the patterned metamaterial lenses (120A, 120B, 120C) can be economically manufactured by employing a single material deposition step that forms the metamaterial layer 120L, a single lithographic patterning step including application, exposure, and development of a photoresist layer, a single etch step that transfers the pattern in the photoresist layer through the metamaterial layer 120L, and a single photoresist removal step.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A light emitting device, comprising:

a backplane;

a first light emitting diode, a second light emitting diode, and a third light emitting diode located on the backplane;

a first patterned metamaterial lens comprising first nanostructures located over the first light emitting diode;

a second patterned metamaterial lens comprising second nanostructures located over the second light emitting diode;

a third patterned metamaterial lens comprising third nanostructures located over the third light emitting diode, wherein a configuration of the first nanostructures is different from a configuration of the second nanostructures, and a configuration of the third nanostructures is different from the configuration of the first nanostructures and the configuration of the second nanostructures, and wherein the first patterned metamaterial lens, the second patterned metamaterial lens, and the third patterned metamaterial lens comprise a same metamaterial;

a transparent conductive material layer between the first patterned metamaterial lens, the second patterned metamaterial lens, and the third patterned metamaterial lens and the first light emitting diode, the second light emitting diode, and the third light emitting diode respectively; and each of the first light emitting diode, the second light emitting diode, and the third light emitting diode comprising a reflector, the reflector being electrically connected to a doped compound semiconductor portion through an opening in an insulating spacer, the insulating spacer providing electrical isolation between the doped compound semiconductor portion and an active layer of a respective light emitting diode.

2. The light emitting device of claim 1, wherein:

the configuration of the first nanostructures is different from the configuration of the second nanostructures by at least one of size, spacing or direction; and the configuration of the third nanostructures is different from the configuration of the first nanostructures and the configuration of the second nanostructures by at least one of size, spacing or direction.

3. The light emitting device of claim 2, wherein:

the first nanostructures have a different size than the second nanostructures; and the third nanostructures have a different size than the second nanostructures.

4. The light emitting device of claim 1, wherein:

the first light emitting diode is configured to emit red light;

the second light emitting diode is configured to emit green light;

the third light emitting diode is configured to emit blue light;

the first patterned metamaterial lens is configured to optimize collimation of red light;

the second patterned metamaterial lens is configured to optimize collimation of green light; and the third patterned metamaterial lens is configured to optimize collimation of blue light.

5. The light emitting device of claim 4, further comprising a dielectric matrix layer laterally surrounding the first light emitting diode, the second light emitting diode, and the third light emitting diode.

6. The light emitting device of claim 4, further comprising: separators surrounding optical cavities, wherein the first light emitting diode, the second light emitting diode and the third light emitting diode are located in respective optical cavities; and wherein the reflectors of the first light emitting diode, the second light emitting diode, and the third light emitting diode are located on sidewalls of the separators.

7. The light emitting device of claim 6, further comprising cavity-fill dielectric material portions located within the optical cavities, and overlying the first light emitting diode, the second light emitting diode, and the third light emitting diode.

8. The light emitting device of claim 7, wherein the transparent conductive material layer overlies a distal surface of the cavity-fill dielectric material portions.

9. The light emitting device of claim 4, wherein each of the first light emitting diode, the second light emitting diode, and the third light emitting diode comprises a vertical stack including a first doped compound semiconductor layer of a first conductivity type, a second doped compound semiconductor layer of a second conductivity type, the second doped compound semiconductor layer comprises the doped compound semiconductor portion, and the active layer configured to emit light at a respective peak wavelength located between the first doped compound semiconductor layer and the second doped compound semiconductor layer.

10. The light emitting device of claim 1, wherein each of the first light emitting diode, the second light emitting diode, and the third light emitting diode is configured to emit incident radiation having a same peak wavelength.

11. The light emitting device of claim 10, wherein the incident radiation comprises ultraviolet radiation or blue light.

12. The light emitting device of claim 11, further comprising:

a first color conversion medium portion overlying the first light emitting diode, and configured to convert the incident radiation into a first emission light having a first peak wavelength;

a second color conversion medium portion overlying the second light emitting diode, and configured to convert the incident radiation into a second emission light having a second peak wavelength; and a third color conversion medium portion overlying the third light emitting diode, and configured to convert the incident radiation into a third emission light having a third peak wavelength, wherein the first peak wavelength, the second peak wavelength, and the third peak wavelength are different from each other.

13. The light emitting device of claim 12, wherein:

the first patterned metamaterial lens is located above the first light emitting diode;

the second patterned metamaterial lens is located above the second light emitting diode; and the third patterned metamaterial lens is located above the third light emitting diode.

14. The light emitting device of claim 13, wherein:

the first emission light comprises red light;

the second emission light comprises green light;

the third emission light comprises blue light;

the first patterned metamaterial lens is configured to optimize collimation of red light;

the second patterned metamaterial lens is configured to optimize collimation of green light; and the third patterned metamaterial lens is configured to optimize collimation of blue light.

15. The light emitting device of claim 12, wherein each of the first color conversion medium portion, the second color conversion medium portion, and the third color conversion medium portion comprises quantum dots.

16. The light emitting device of claim 1, wherein the light emitting device comprises a display device.

17. The light emitting device of claim 16, wherein:

the first light emitting diode and the first patterned metamaterial lens are located in a first subpixel of a pixel of the display device;

the second light emitting diode and the second patterned metamaterial lens are located in a second subpixel of the pixel of the display device; and the third light emitting diode and the third patterned metamaterial lens are located in a third subpixel of the pixel of the display device.

18. The light emitting device of claim 16, wherein the display device comprises a heads up display device.

19. The light emitting device of claim 16, wherein the display device comprises a virtual reality display device.

20. The light emitting device of claim 16, wherein the display device comprises an artificial reality display device.

* * * * *